(12) United States Patent
Assefa et al.

(10) Patent No.: US 8,765,502 B2
(45) Date of Patent: Jul. 1, 2014

(54) GERMANIUM PHOTODETECTOR SCHOTTKY CONTACT FOR INTEGRATION WITH CMOS AND SI NANOPHOTONICS

(75) Inventors: Solomon Assefa, Ossining, NY (US); Jeffrey P. Gambino, Westford, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/561,177

(22) Filed: Jul. 30, 2012

(65) Prior Publication Data

US 2014/0027826 A1    Jan. 30, 2014

(51) Int. Cl.
  *H01L 21/00*    (2006.01)
  *H01L 35/34*    (2006.01)
  *H01L 51/50*    (2006.01)

(52) U.S. Cl.
  CPC ............. *H01L 35/34* (2013.01); *H01L 51/50* (2013.01)
  USPC .............................. 438/31; 438/69; 438/154

(58) Field of Classification Search
  CPC ................................ H01L 35/34; H01L 51/50
  USPC .............. 257/290, 431–432; 438/31, 69, 154
  See application file for complete search history.

(56) References Cited

U.S. PATENT DOCUMENTS

| | | | |
|---|---|---|---|
| 6,756,651 B2 | 6/2004 | Bozso et al. | |
| 7,157,300 B2 | 1/2007 | Lee et al. | |
| 7,262,117 B1 | 8/2007 | Gunn, III et al. | |
| 7,566,875 B2 | 7/2009 | Starikov et al. | |
| 7,616,904 B1 | 11/2009 | Gunn, III et al. | |
| 2011/0147870 A1* | 6/2011 | Ang et al. | 257/432 |
| 2012/0129302 A1* | 5/2012 | Assefa et al. | 438/154 |

OTHER PUBLICATIONS

Sridaran et al. "Nanophotonic devices on thin buried oxide Silicon-On-Insulator substrates", Cornell University, Ithaca, NY. Published Feb. 11, 2010, vol. 18, No. 4, pp. 3850-3857.

\* cited by examiner

*Primary Examiner* — Laura Menz
(74) *Attorney, Agent, or Firm* — Keivan Razavi; Michael LeStrange

(57) ABSTRACT

A method of forming an integrated photonic semiconductor structure having a photodetector device and a CMOS device may include depositing a dielectric stack over the photodetector device such that the dielectric stack encapsulates the photodetector. An opening is etched into the dielectric stack down to an upper surface of a region of an active area of the photodetector. A first metal layer is deposited directly onto the upper surface of the region of the active area via the opening such that the first metal layer may cover the region of the active area. Within the same mask level, a plurality of contacts including a second metal layer are located on the first metal layer and on the CMOS device. The first metal layer isolates the active area from the occurrence of metal intermixing between the second metal layer and the active area of the photodetector.

11 Claims, 21 Drawing Sheets

GERMANIUM PHOTODETECTOR SCHOTTKY CONTACT FOR INTEGRATION WITH CMOS AND SI NANOPHOTONICS

BACKGROUND a. Field of the Invention

The present invention generally relates to semiconductor devices, and particularly to integrated photonic semiconductor devices.

b. Background of Invention

The use of both photonic devices in high-speed switching and transceiver devices in data communications are but a few examples that highlight the advantages of processing both optical and electrical signals within a single integrated device. For example, an integrated photonic device may include both photodetector and CMOS type devices that may be fabricated on a single silicon substrate. However, during the fabrication process, certain processes, while benefiting or being necessary for the formation and/or operation of one type of device (e.g., CMOS FET), may be detrimental to the formation and/or operation of the other type of device (e.g., Photodetector).

One such fabrication process may, for example, include the formation of contacts in integrated photonic devices. It may, therefore, be advantageous to provide, among other things, contact formation processes that are capable of, for example, enhancing or retaining integrated photonic device performance.

BRIEF SUMMARY

According to at least one exemplary embodiment, a method of forming an integrated photonic semiconductor structure having a photodetector device and a CMOS device is provided. The method may include depositing a dielectric stack over the photodetector device, where the dielectric stack encapsulates the photodetector. An opening may be etched into the dielectric stack down to the upper surface of a region of an active area of the photodetector. A first metal layer may then be deposited via the opening directly onto the upper surface of the region of the active area such that the first metal layer covers the region of the active area. A plurality of contacts that include a second metal layer are formed within the same mask level, whereby the second metal layer may be located on the first metal layer and on at least one contact area corresponding to the CMOS device. The first metal layer may isolate the active area from the occurrence of metal intermixing between the second metal layer and the active area of the photodetector.

According to at least one other exemplary embodiment, an integrated photonic semiconductor structure may include a semiconductor substrate, a Schottky metal contact, a plurality of contacts; a dielectric stack having an opening; and a photodetector and a CMOS device both located on the semiconductor substrate. The photodetector device may include an active area region encapsulated by the dielectric stack and the Schottky metal contact, whereby the Schottky metal contact is located within the opening and may be in direct contact with a portion of the active area region and one of the plurality of contacts. The CMOS device may be coupled to at least one other of the plurality of contacts. The Schottky metal contact may isolate the portion of active area region from the occurrence of metal intermixing between the one of the plurality of contacts and the portion of the active area region.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following structure and processes provide exemplary embodiments of a CMOS integrated nanophotonics device that includes, for example, both a photonic device such as a Germanium (GE) photodetector and a CMOS device such as an FET transistor. Within the CMOS integrated nanophotonic circuits, crystalline materials such as germanium or III-V compounds may be utilized as an active element of the photodetector component based on their high quantum efficiency. Using a liquid phase epitaxy technique, films (e.g., Germanium) can be deposited at low temperatures in an amorphous state, and subsequently crystallized thermally. During the crystallization process, the Germanium material forming the photodetector active region may be encapsulated, using a film stack, in order to prevent crystalline defects and contamination as a result of outdiffusion. To establish an electrical contact with the Germanium active region, contact integration occurs via the film stack. Electrical contact with the Germanium active region may be accomplished using a Schottky contact (i.e., a metal-semiconductor rectifying contact) in order to yield low photodetector dark current.

Figure 1A:
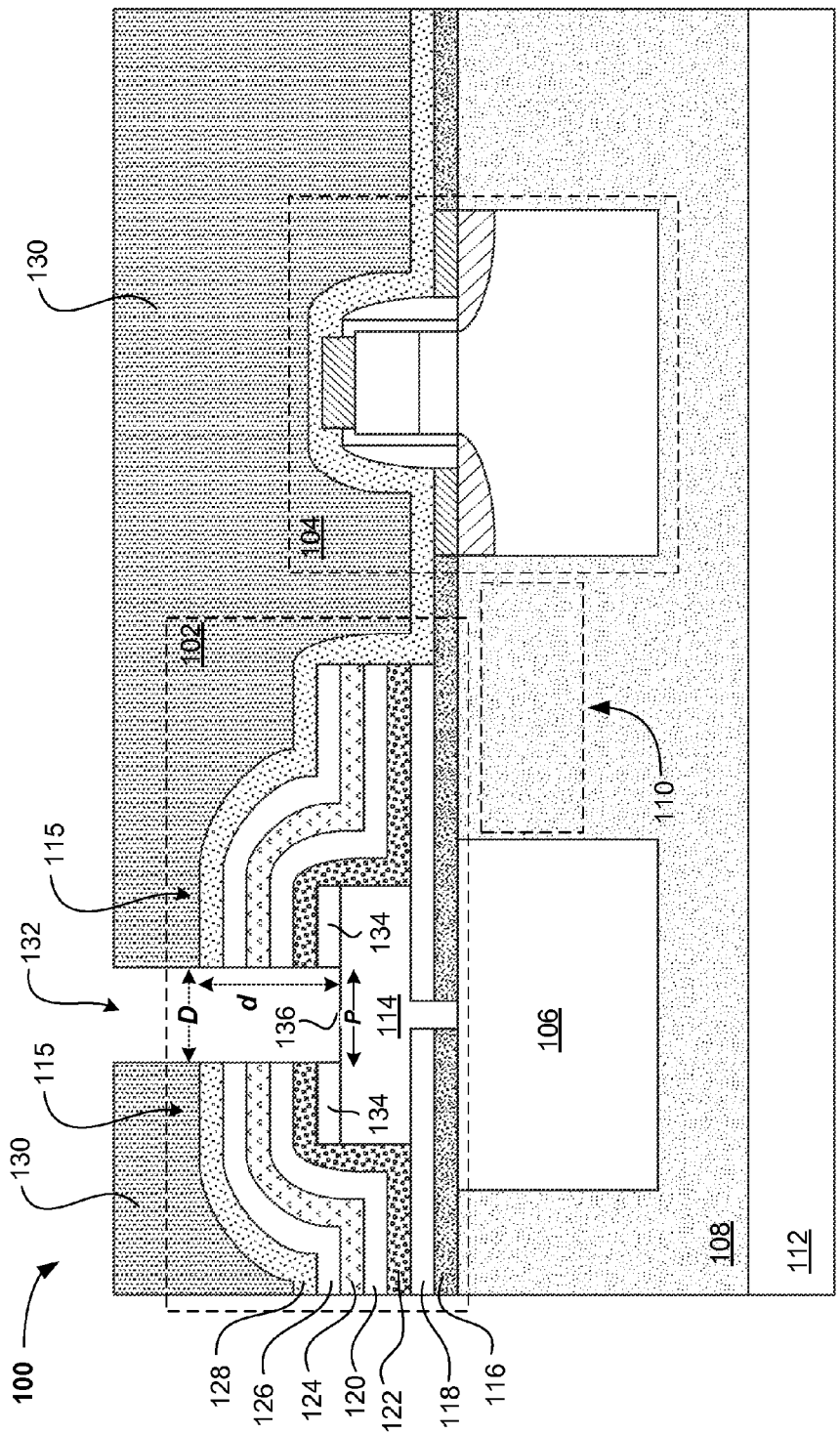
FIGS. 1A-1I are vertical cross-sectional views of an integrated photonic semiconductor device structure during Schottky contact integration according to an exemplary embodiment.

FIGS. 1A-1H are vertical cross-sectional views of an integrated photonic semiconductor device structure during Schottky contact integration according to an exemplary embodiment. Referring to FIG. 1A, an integrated photonic semiconductor structure 100 is illustrated. The integrated photonic semiconductor structure 100 may include a photonic device such as a Germanium (GE) photodetector 102 and a CMOS device such as an FET transistor 104. The integrated photonic semiconductor structure 100 may further include an optical waveguide structure 106, a buried oxide (BOX) region 108, a shallow trench isolation (STI) region 110, and silicon substrate 112. The BOX region 108 is located over the silicon substrate 112. The optical waveguide structure 106 may be formed within the BOX region 108 in order to facilitate optical confinement and low-loss waveguiding. The STI region 110 may provide electrical isolation between the Germanium (Ge) photodetector 102 and the FET transistor 104.

As depicted, the Germanium (Ge) photodetector 102 may include a Ge active region 114 for receiving and detecting an optical signal from optical waveguide structure 106. The optical signal traversing within the optical waveguide structure 106 may be received by the active region 114 through a thin oxide layer 116 and a thin nitride layer 118. Although any received optical signal received by the active region 114 is attenuated by thin layers 116 and 118, based on the thickness of these layers 116, 118, the attenuation is low enough in order to not impede the operation and sensitivity of the photodetector. For example, thin oxide layer 116 may be about 50 Å and thin nitride layer 118 may be about 400 Å.

The thin oxide layer 116 and thin nitride layer 118, along with oxide layer 120 and nitride layers 122-126, may create a dielectric stack structure 115 that encapsulates the Ge active region 114 of the photodetector 102. The dielectric stack structure 115, which may include oxide layers 116 and 120, and nitride layers 118 and 122-126, encapsulates the Ge active region 114 during the crystallization process of the Ge active region 114 in order to prevent crystalline defects and contamination as a result of outdiffusion that may occur during high-temperature processes (e.g., epitaxial growth). The oxide and nitride layer of the dielectric stack structure 115 may each have thicknesses that vary from, for example, about 1000-3000 Angstroms (Å). Also, each of the nitride and oxide layers may include different stress characteristics (e.g., compressive or tensile characteristics). A barrier nitride layer 128, such as silicon nitride ($Si_3N_4$), may be deposited over nitride layer 126 of the dielectric stack 115. The barrier nitride ($Si_3N_4$) may be used as an etch stop during subsequent process steps (e.g., see FIG. 1C).

As depicted in FIG. 1A, during a photolithographic process, a photo resist layer 130 (e.g., thickness ~8000 Å) may be patterned in order to allow an opening 132 to be etched (e.g., using a dry etch such as a reactive ion etch) into the dielectric stack structure 115. Accordingly, the etch process etches down to the upper surface 136 of the Ge active region 114 by etching through barrier nitride layer 128, nitride layers 122-126, oxide layer 120, and hard mask layer 134. As illustrated, a portion P of the Ge active region 114 is now exposed for facilitating the Schottky contact integration process. Opening 132 may have a depth (d) of about 3000 Å, as measured with respect to barrier nitride layer 128, and a diameter/width (D) of approximately 0.15-0.25 μm. define length (d) from top of layer 128.

Figure 1B:
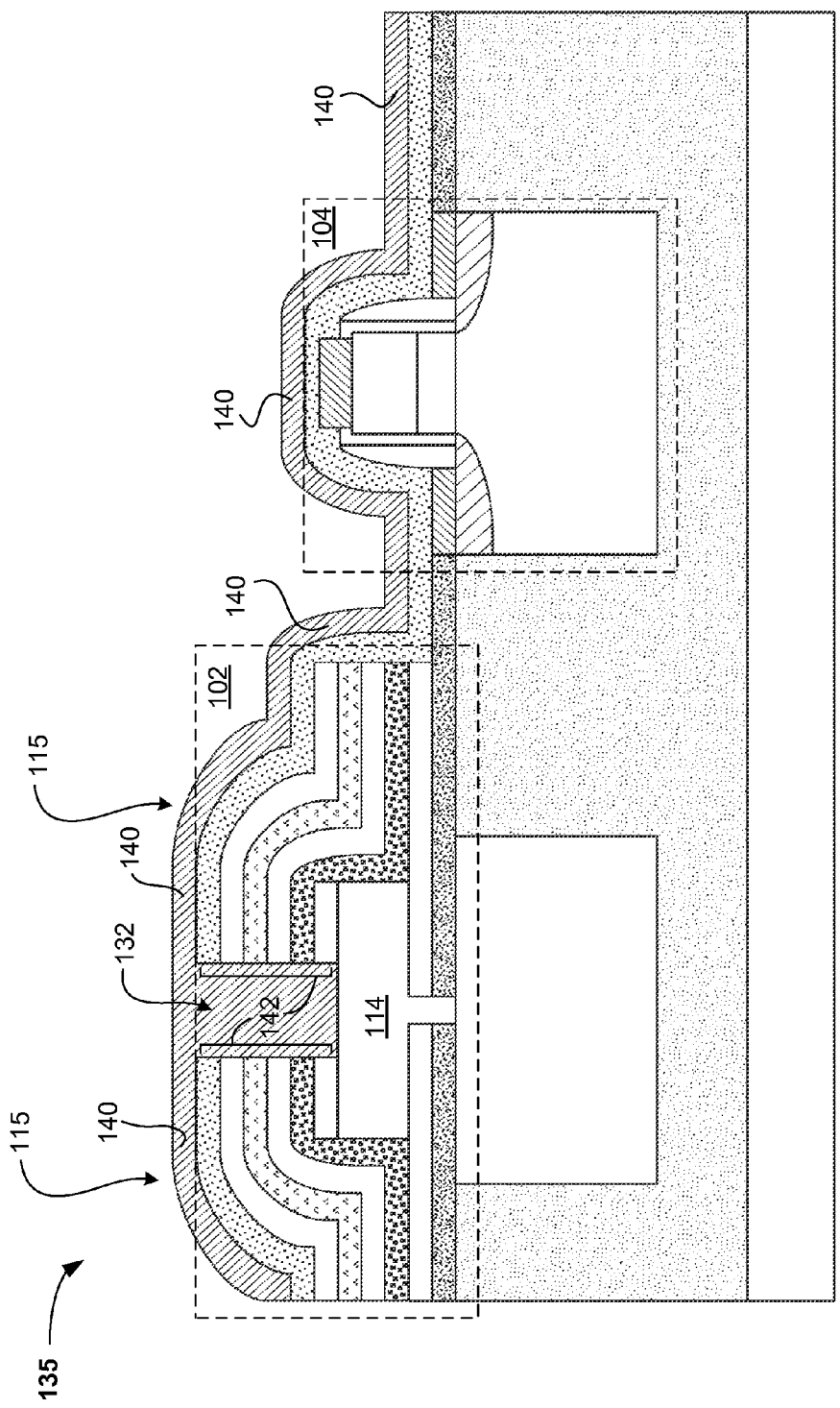

Referring to FIG. 1B, integrated photonic semiconductor structure 135 is formed by removing photo resist layer 130 (FIG. 1A) from integrated photonic semiconductor structure 100 (FIG. 1A). A metal layer 140 may then be deposited over the entire integrated photonic semiconductor structure 135. As illustrated, the metal layer 140 also fills opening 132 (also see FIG. 1A). The metal layer 140 may include, for example, titanium nitride (TiN), tantalum nitride (TaN), pulse nucleation layer tungsten (W PNL), and physical vapor deposition tungsten (W PVD). The metal layer 140 is selected to be a material that does not intermix with the Ge active region 114 during subsequent process steps (e.g., thermal anneals).

Following the removal of the photo resist layer 130 (FIG. 1A) and prior to depositing the metal layer 140, the surface of the Ge active region 114 may be modified by a barrier tailor implant. Such a barrier tailor implant process is self-aligned with the walls 142 of the dielectric stack structure 115 created by opening 132. For example, n-type dopants such as phosphorous (P), nitrogen (N), arsenic (As), antimony (Sb), or sulfur (S) may be implanted into the surface of the Ge active region 114 in order to increase the barrier height for holes and reduce dark current. Alternatively, p-type dopants such as boron (B) or indium (In) may be implanted into the surface of the Ge active region 114 in order to increase the barrier height for electrons, also reducing dark current.

Figure 1C:
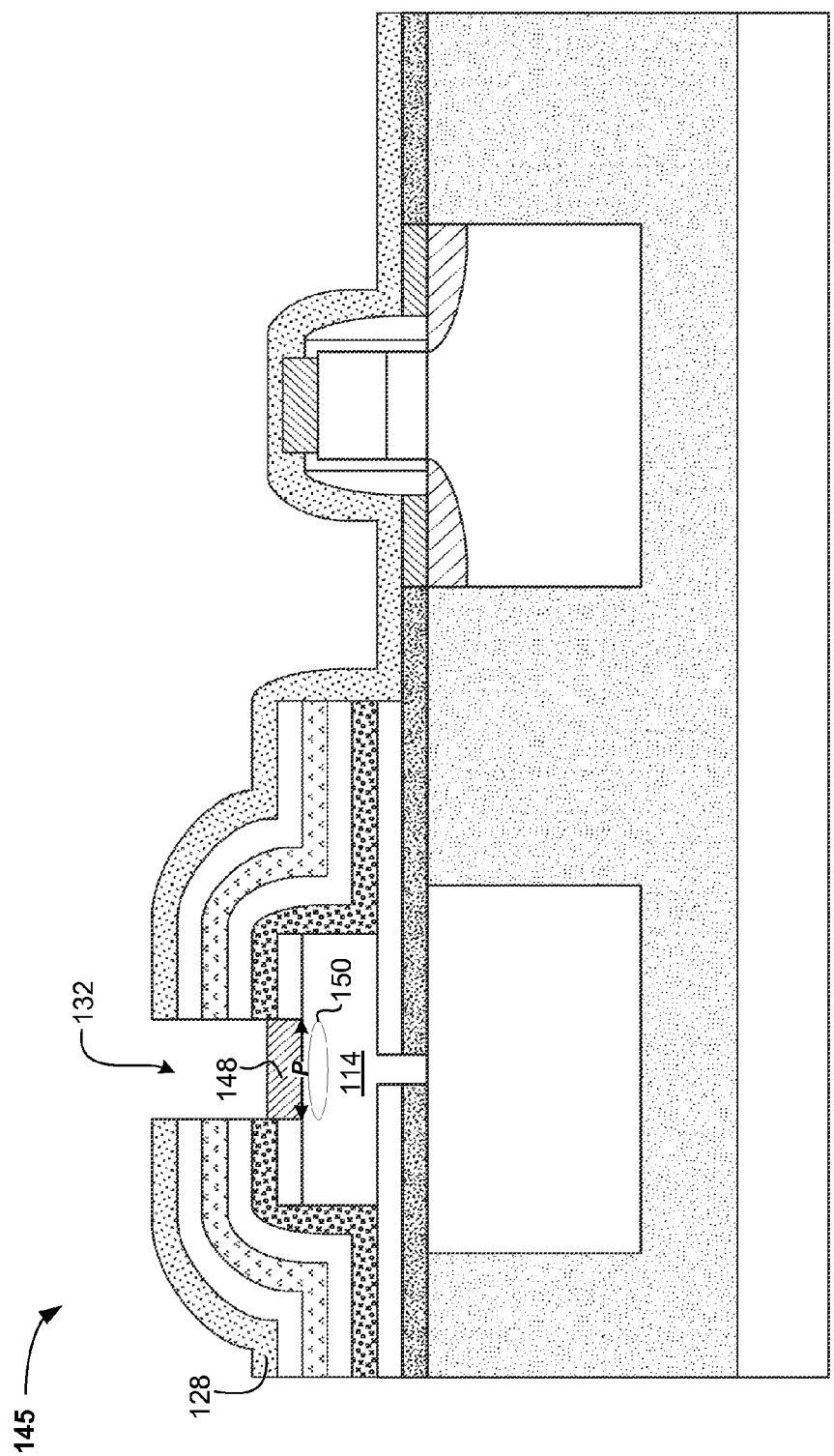

Referring to FIG. 1C, integrated photonic semiconductor structure 145 may be formed by blanket etching integrated photonic semiconductor structure 135 (FIG. 1B). As illustrated, barrier nitride layer 128 acts as an etch stop during the etching of the metal layer 140 (FIG. 1B). Thus, metal contact layer 148 may be formed by etching away the metal layer 140 (FIG. 1B) from the surface of the integrated photonic semiconductor structure 145 and part of the metal layer deposited within the opening 132. The metal contact layer 148 directly contacts the portion P of the Ge active region 114 that is exposed by the opening 132 to form a metal-germanium (Ge) Schottky contact 148. As described above, n-type or p-type dopants may (optionally) be implanted into the surface of the Ge active region 114, as defined at region 150, in order to reduce dark current for the metal-Ge Schottky contact 148. The metal-Ge Schottky contact 148 may have a thickness of about 1000 Å.

Figure 1D:
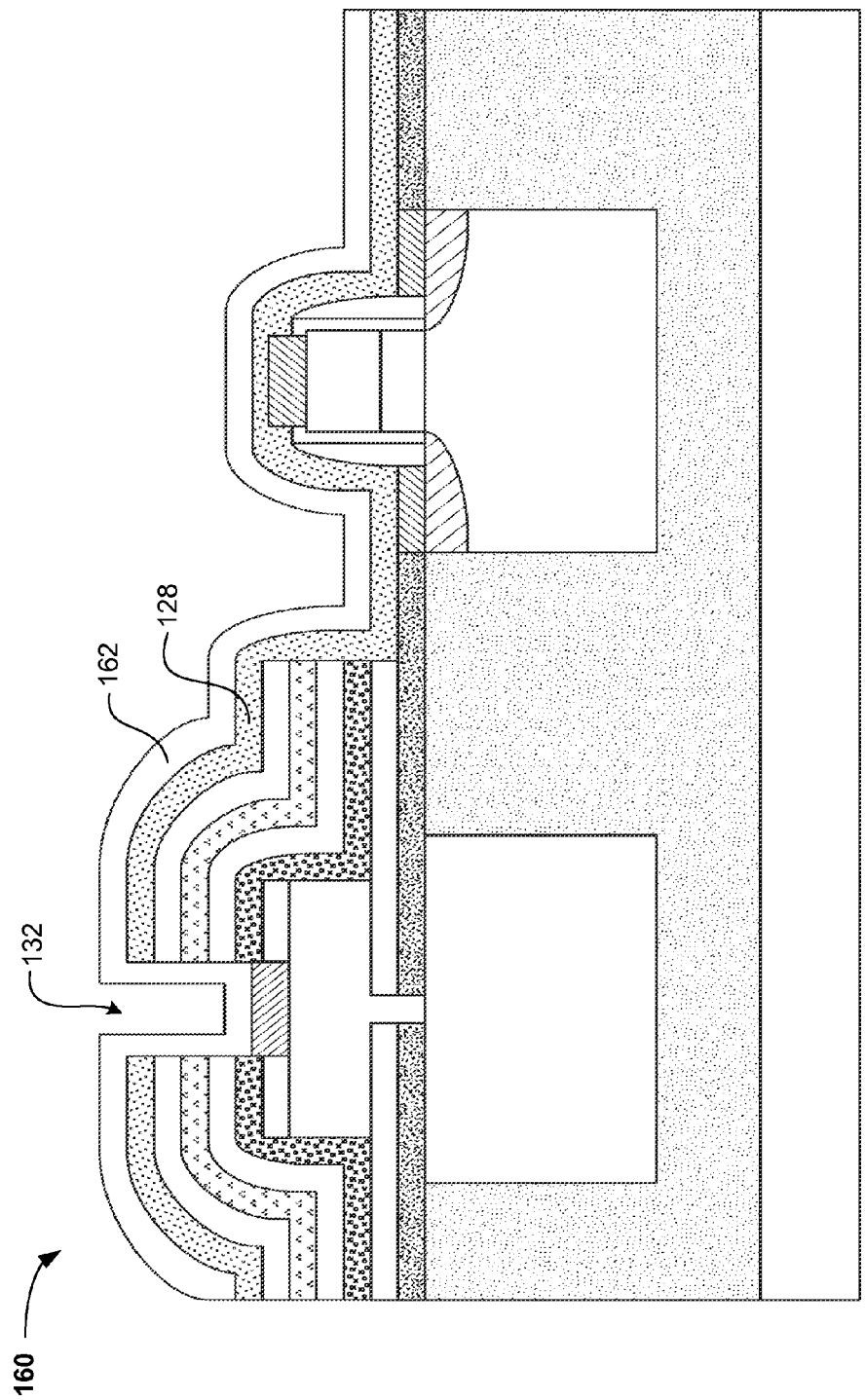

Referring to FIG. 1D, integrated photonic semiconductor structure 160 is formed by depositing an oxide or a nitride liner 162 over integrated photonic semiconductor structure 145 (FIG. 1C). As illustrated, the oxide or nitride liner 162 is deposited over barrier nitride layer 128, the metal-germanium (Ge) Schottky contact 148, and the walls 142 (FIG. 1B) of opening 132.

Figure 1E:
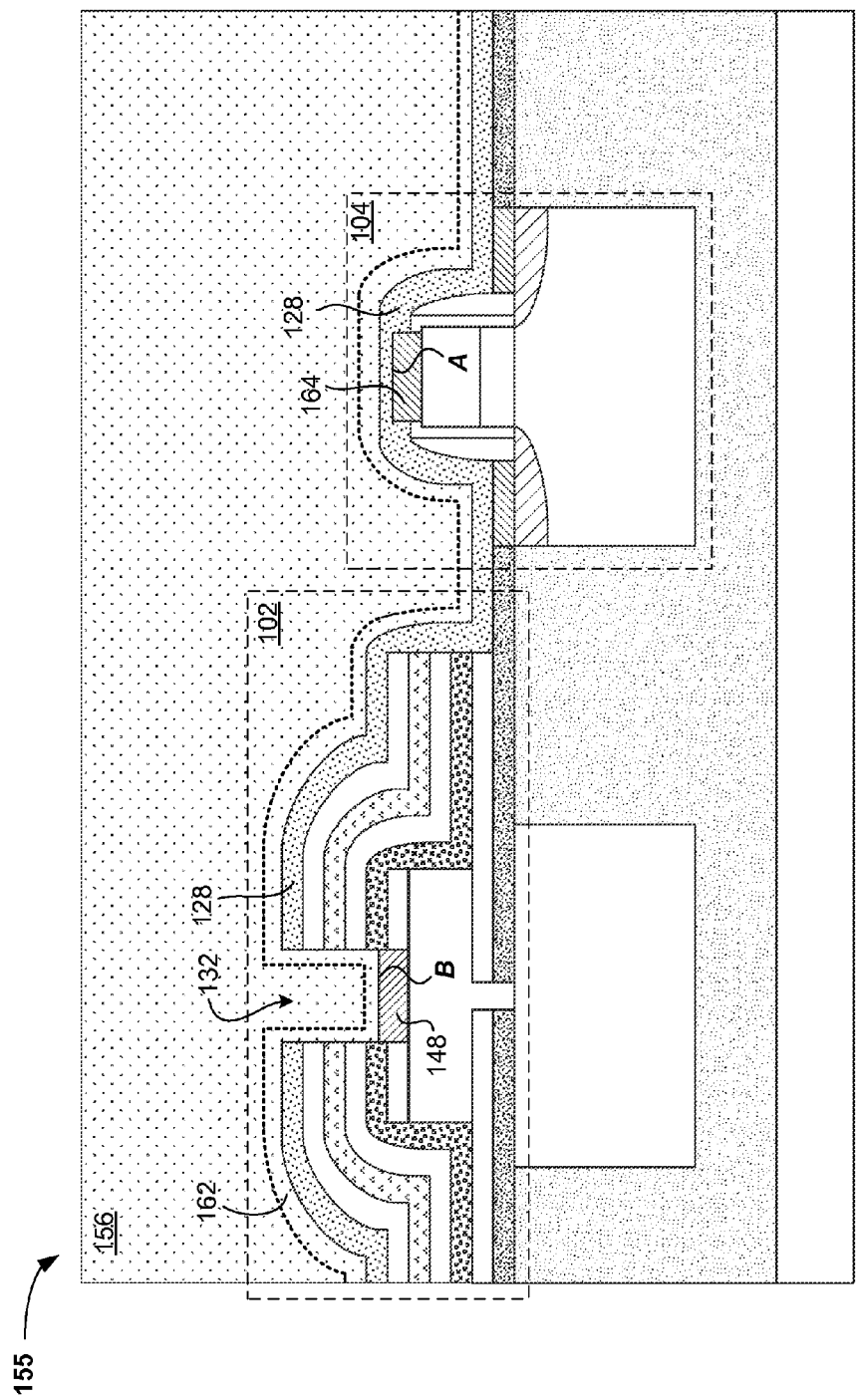

As illustrated in FIG. 1E, integrated photonic semiconductor structure 155 may be formed by depositing a thick oxide layer (e.g., 1 μm thickness) of borophosphosilicate glass (BPSG) 156 over integrated photonic semiconductor structure 145 (FIG. 1C) and planarizing the BPSG layer 156 using, for example, chemical mechanical polishing (CMP). The BPSG layer 156 may be used in subsequent contact formation steps corresponding to both the Germanium (GE) photodetector 102 and the FET transistor 104. In an alternative implementation, integrated photonic semiconductor structure 155 may be formed by depositing the thick oxide layer of borophosphosilicate glass (BPSG) 156 over integrated photonic semiconductor structure 160 (FIG. 1D). In this implementation, the thick oxide layer of borophosphosilicate glass (BPSG) 156 may be formed over the optionally deposited oxide or nitride liner 162.

During subsequent contact integration processes for both the Germanium (Ge) photodetector 102 and the FET transistor 104, the optional oxide or nitride liner 162 may act as an etch stop when etching through the BPSG layer 156 down to the metal-germanium (Ge) Schottky contact 148 and the gate silicide contact 164 of the FET transistor 104. The etch stop provided by the oxide or nitride liner 162 establishes a means of avoiding the over-etching of both the gate silicide contact 164 and the metal-germanium (Ge) Schottky contact 148 during the BPSG layer 156 etch phase.

One or more subsequent etches (e.g., 2-stage oxide etch and 2-stage nitride etch) may then be carried out to provide an opening (not shown) in the oxide or nitride liner 162 and the barrier nitride layer 128 down to the upper surface of the gate silicide contact 164, as defined by surface A. The one or more subsequent etches may also provide an opening (not shown) in the oxide or nitride liner 162 down to the upper surface of the metal-germanium (Ge) Schottky contact 148, as defined by surface B. Although the oxide or nitride liner 162 may include either a deposited oxide liner or a nitride liner, by utilizing a nitride type liner (e.g., $Si_3N_4$) material, a single nitride etch process step may be used to create an opening down to surfaces A and B of gate silicide contact 164 and metal-germanium (Ge) Schottky contact 148, respectively.

Additionally, the deposition of the oxide or nitride liner 162 may protect the underlying metal-germanium (Ge) Schottky contact 148 based on the possible occurrence of voiding during the filling of the opening 132 with BPSG layer 156. For example, if there is voiding, the absence of the oxide or nitride liner 162 may permit the etch process to attack the underlying metal-germanium (Ge) Schottky contact 148. In contrast, the oxide or nitride liner 162 may act as a barrier in the event that the voiding in the opening 132 exposes metal-germanium (Ge) Schottky contact 148 to the etch process (e.g., etch gases). Thus, the etch process attacks the oxide or nitride liner 162 rather than the metal-germanium (Ge) Schottky contact 148.

Figure 1F:
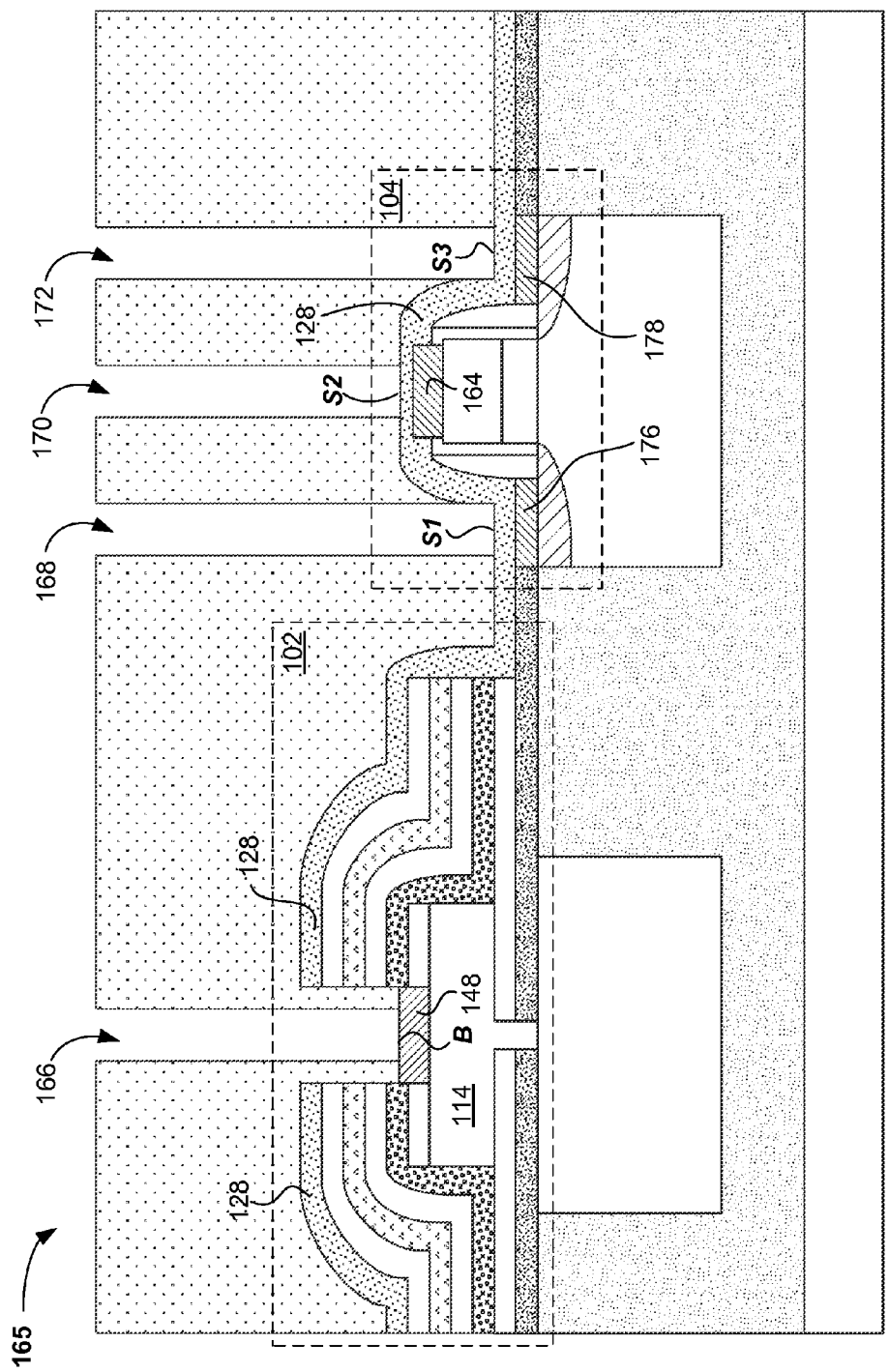

Referring to FIG. 1F, integrated photonic semiconductor structure 165 may be formed by photolithographic patterning and etching of integrated photonic semiconductor structure 155 (FIG. 1E). Particularly, the BPSG layer 156 (FIG. 1E) may be patterned, within the same mask, and etched to create contact holes 166-172. The contact holes 166-172 enable the formation of an electrical contact to both the Germanium (Ge) photodetector 102 and the FET transistor 104 devices. As depicted, contact hole 166 facilitates the creation of an electrical contact to the metal-germanium (Ge) Schottky contact 148 of the Germanium (Ge) photodetector 102, contact hole 170 facilitates the creation of an electrical contact to the gate silicide contact 164 of FET transistor 104, and contact holes 168 and 172 enable the forming of electrical contacts to source/drain silicide contacts 176 and 178 of FET transistor 104, respectively. As illustrated, contact hole 166 is formed within opening 132 and is, therefore, of a smaller diameter than the opening 132.

According to the exemplary embodiment shown in FIG. 1F, the optional oxide or nitride liner 162 (FIG. 1E) may be omitted. Therefore, the etching of the contact holes 168-172 that corresponds to the FET transistor 104 stops on the barrier nitride layer 128, as defined at surfaces S1-S3. Since the metal-germanium (Ge) Schottky contact 148 is not covered by an etch stop layer such as barrier nitride layer 128, the etching process may be stopped on the surface B of the metal-germanium (Ge) Schottky contact 148 in order to avoid the over-etching of the metal material forming the contact 148.

Once the contact hole etch process (FIG. 1F) is performed, etch residue associated with the BPSG layer 156 may be removed using POR (process-of-record) post-etch cleaning methods using chemicals such as, for example, hydrogen peroxide ($H_2O_2$), ammonium hydroxide ($NH_4OH$), hydrochloric acid (HCL), and hydrofluoric acid (HF). Since the above-mentioned residue-cleaning chemistry can etch away the germanium material of the Ge active region 114, the metal-germanium (Ge) Schottky contact 148 may act as a plug that seals the underlying Ge active region 114 from exposure to such residue-cleaning chemistry. Thus, the metal-germanium (Ge) Schottky contact 148 facilitates the cleaning process by protecting the Ge active region 114 from damage caused by the cleaning chemicals.

Figure 1G:
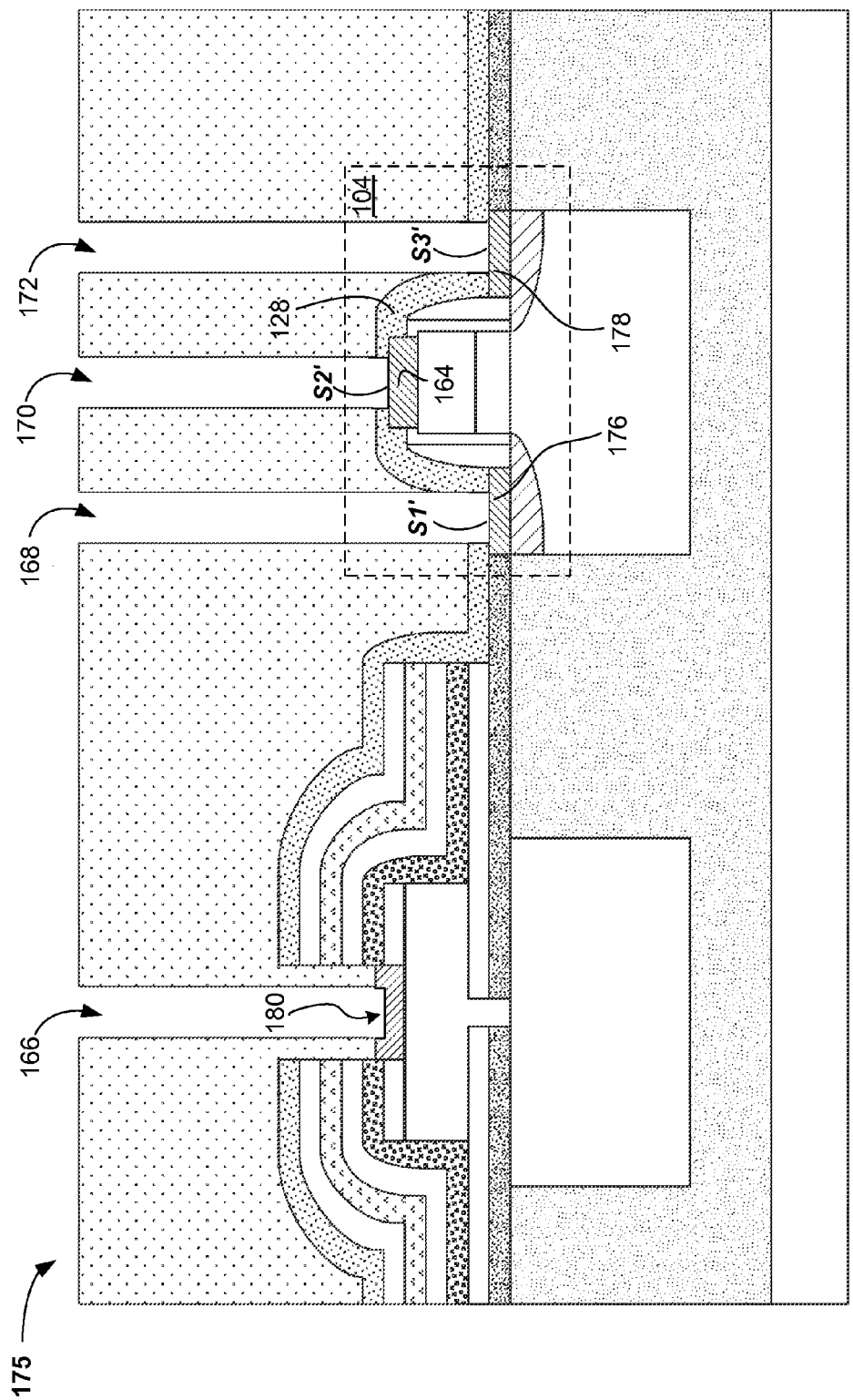

Referring to FIG. 1G, integrated photonic semiconductor structure 175 may be formed by a second etch of integrated photonic semiconductor structure 165 (FIG. 1F). Accordingly, during a subsequent etch, the barrier nitride layer 128 over surfaces S1-S3 (FIG. 1F) is etched away in order to extend the contact holes 168-172 down to surfaces S1'-S3' of silicide contacts 176, 164, and 178, respectively. Also, as depicted at 180, during the etching of the barrier nitride layer 128 located over surfaces S1-S3 (FIG. 1F), a portion of the metal-germanium (Ge) Schottky contact 148 may also be etched away. In order to minimize etching into the metal-germanium (Ge) Schottky contact 148, a low metal etch rate may be used.

Once the contact hole etch process illustrated with regards to FIG. 1G is performed, etch residue may be removed using POR (process-of-record) post-etch cleaning methods using chemicals such as, for example, hydrogen peroxide ($H_2O_2$), ammonium hydroxide ($NH_4OH$), hydrochloric acid (HCL), and hydrofluoric acid (HF). As previously described, the above-mentioned residue-cleaning chemistry can etch away the germanium material of the Ge active region 114. Thus, the metal-germanium (Ge) Schottky contact 148 may seal and, therefore, protect the underlying Ge active region 114 from exposure to such residue-cleaning processes.

Figure 1H:
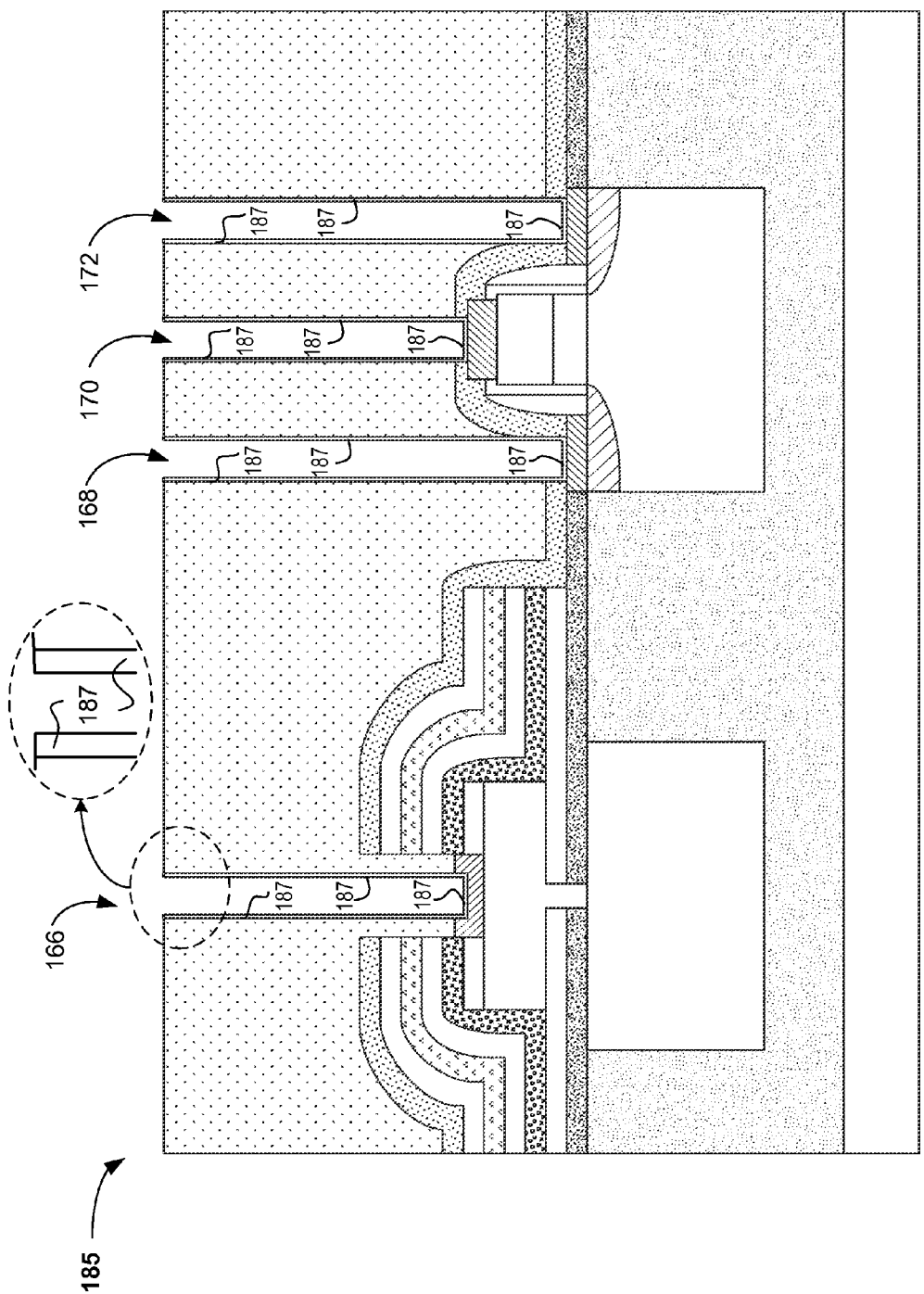

Referring to FIG. 1H, integrated photonic semiconductor structure 185 may be formed by depositing a first metal liner 187 over the sidewalls and floor of the contact holes 168-172 of integrated photonic semiconductor structure 175 (FIG. 1G). The first metal liner 187 may, for example, include a layer of titanium (Ti).

Figure 1I:
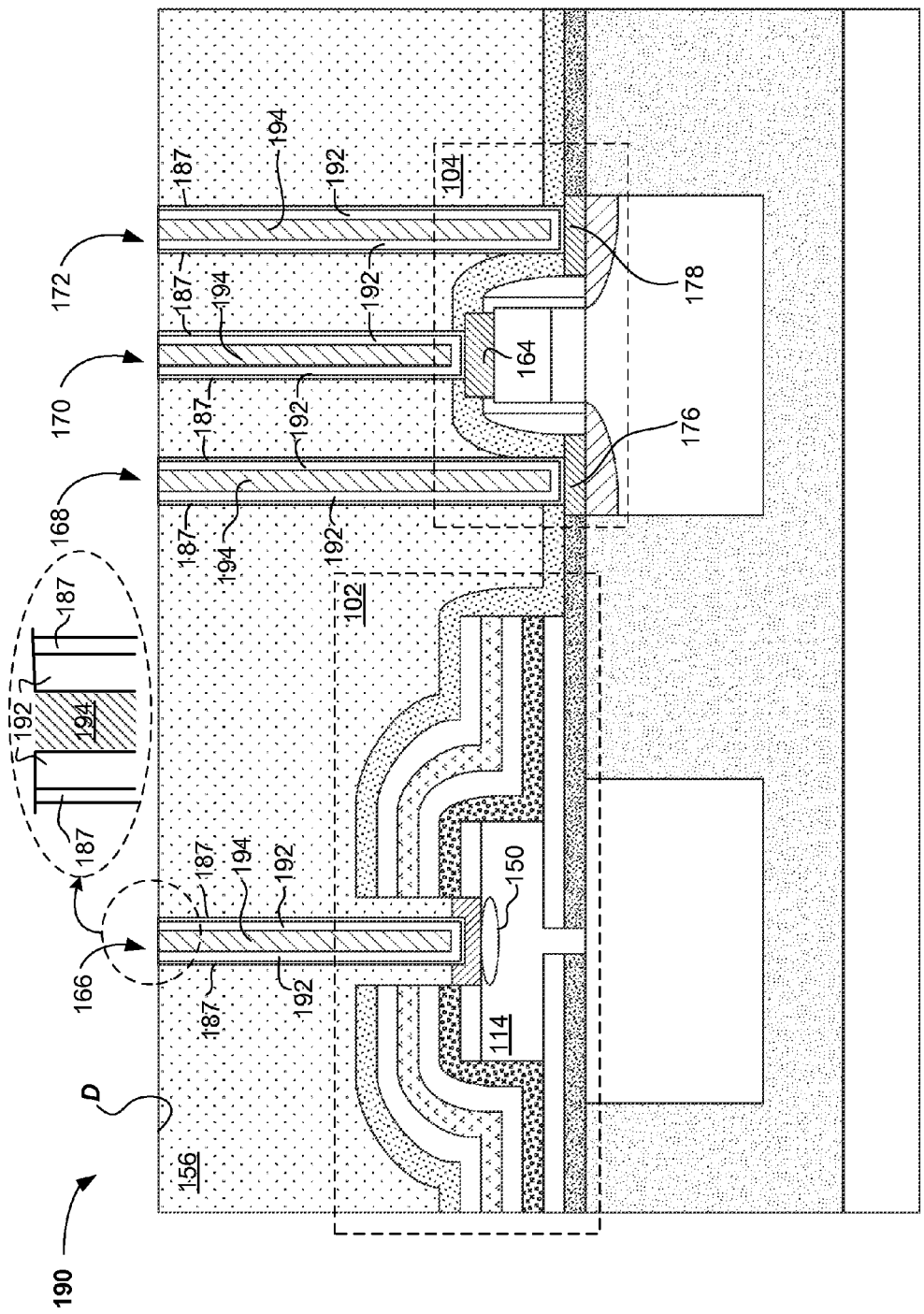

Referring to FIG. 1I, integrated photonic semiconductor structure 190 may be formed by depositing a second liner 192 over first metal liner 187 within contact holes 168-172. The second liner 192 may, for example, include a layer of titanium nitride (TiN). Once the TiN liner 192 is deposited over the Ti metal liner 187, a thermal anneal is carried out in order to cause the deposited Ti/TiN liners 187, 192 to metallically intermix with the cobalt silicide ($CoSi_2$) contacts 164, 176, 178 of the CMOS FET transistor 104. This intermixing provides a lower Ohmic contact resistance between the deposited Ti/TiN liners 187, 192 and the cobalt silicide ($CoSi_2$) contacts 164, 176, 178 of the CMOS FET device 104. Following the anneal process; a tungsten metal fill 194 is deposited over TiN liner 192 within the contact holes 168-172. Any excess tungsten associated with the fill process is planarized down to the upper surface D of the BPSG layer 156. During the thermal anneal process, which provides a reduction in Ohmic contact resistance for the silicide ($CoSi_2$) contacts 164, 176, 178 of the CMOS FET device 104, undesirable intermixing between the material of the deposited Ti/TiN liners 187, 192 and the Ge active region 114 is avoided based on the intermediary of the metal-germanium (Ge) Schottky contact 148 that isolates the Ti/TiN liners 187, 192 from the Ge active region 114. Particularly, during the thermal anneal process, the metal-germanium (Ge) Schottky contact 148 material does not intermix with the Ge active region 114 causing undesirable excess dark current.

Moreover, the increased barrier height of the metal-germanium (Ge) Schottky contact 148 created by barrier tailor implants within region 150 of the Ge active region 114 may further reduce dark current. While the thermal anneal causing metal intermixing is a beneficial process with respect to the CMOS FET device, any resulting metal intermixing may be detrimental to the photodetector 102 as a result of causing an increase in dark current. Accordingly, the described exemplary embodiment provides a means of maintaining the integrity of both the CMOS (e.g., FET: 104) and photonic (e.g., photodetector: 102) devices during the contact integration process, whereby electrical contacts are created for both devices 102, 104.

Figure 1J:
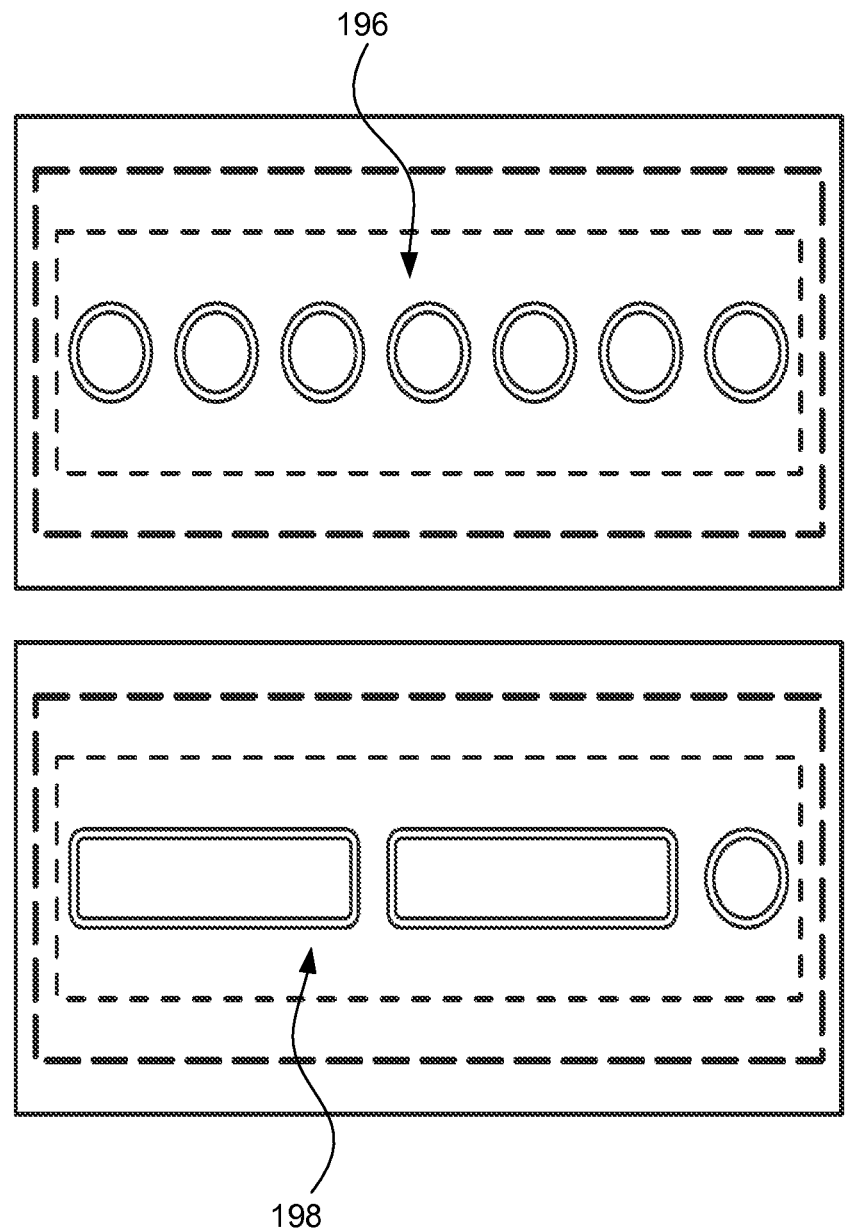
FIG. 1J is a plan view of exemplary contact hole profiles according to different embodiments.

Referring to FIG. 1J, a plan view of example profiles for contact holes 168-172 (e.g., see FIG. 1H) are illustrated. For example, contact holes 168-172 may be substantially circular, as indicated at 196. Alternatively, for example, contact holes 168-172 may be substantially rectangular for forming a contact bar, as indicated at 198.

Figure 2A:
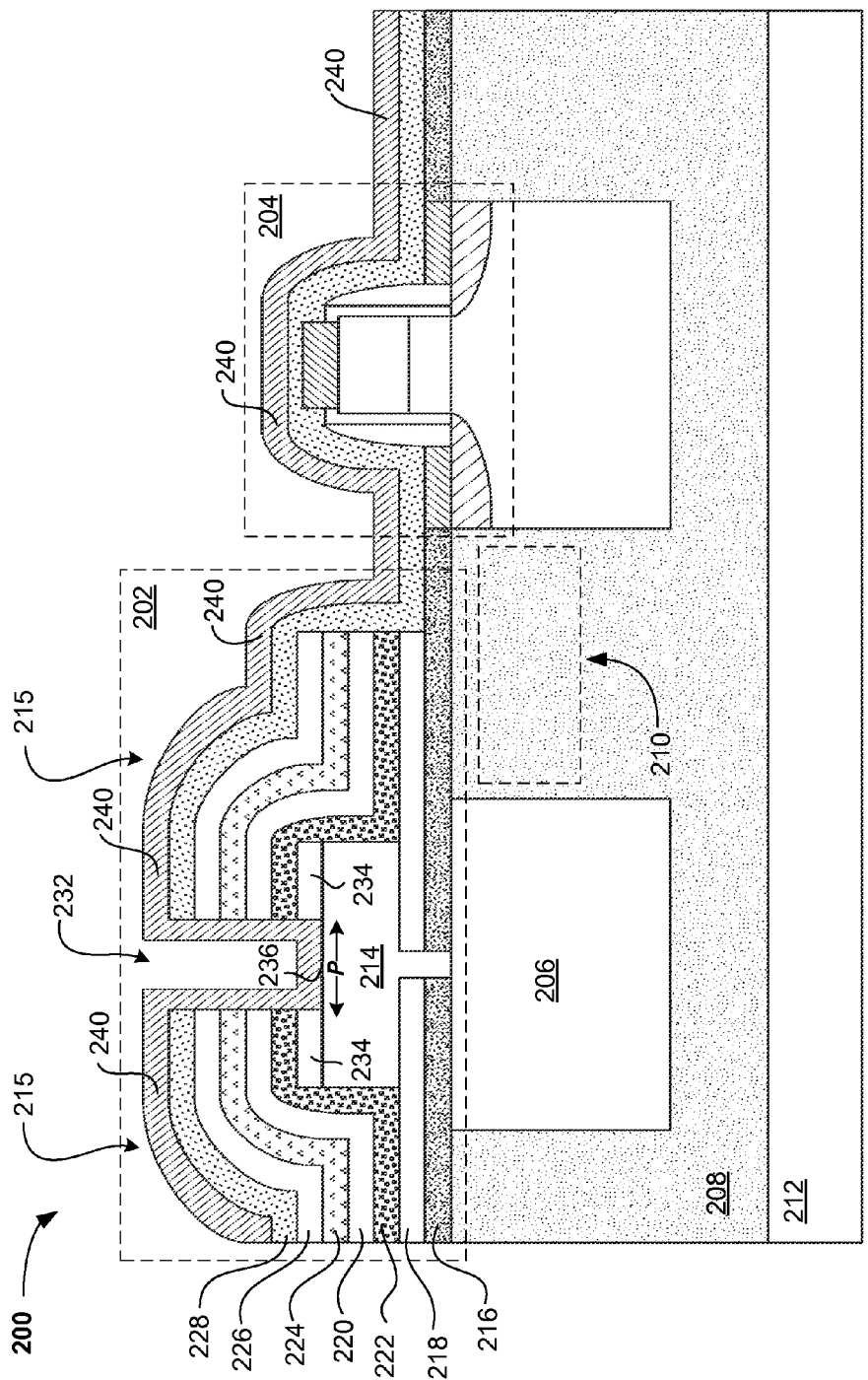
FIGS. 2A-2E are vertical cross-sectional views of an integrated photonic semiconductor device structure during Schottky contact integration according to another exemplary embodiment.

FIGS. 2A-2E are vertical cross-sectional views of an integrated photonic semiconductor device structure during Schottky contact integration according to another exemplary embodiment. Referring to FIG. 2A, an integrated photonic semiconductor structure 200 is illustrated. The integrated photonic semiconductor structure 200 is substantially identical to that of FIG. 1A. Accordingly, the integrated photonic semiconductor structure 200 may include a photonic device such as a Germanium (GE) photodetector 202 and a CMOS device such as an FET transistor 204. The integrated photonic semiconductor structure 200 may further include an optical waveguide structure 206, a buried oxide (BOX) region 208, a shallow trench isolation (STI) region 210, and silicon substrate 212. The BOX region 208 is located over the silicon substrate 212. The optical waveguide structure 206 may be formed within the BOX region 208 in order to facilitate optical confinement and low-loss waveguiding. The STI region 210 may provide electrical isolation between the Germanium (Ge) photodetector 202 and the FET transistor 204.

As depicted, the Germanium (Ge) photodetector 202 may include a Ge active region 214 for receiving and detecting an optical signal from optical waveguide structure 206. The optical signal traversing within the optical waveguide structure 206 may be received by the active region 214 through a thin oxide layer 216 and a thin nitride layer 218. Although any received optical signal received by the active region 214 is attenuated by thin layers 216 and 218, this attenuation is low enough in order to not impede the operation of the photodetector. For example, thin oxide layer 216 may be about 50 Å and thin nitride layer 218 may be about 400 Å.

As previously described, the thin oxide layer 216 and thin nitride layer 218, along with oxide layer 220 and nitride layers 222-226, may create a dielectric stack structure 215 that encapsulates the Ge active region 214 of the photodetector 202. The dielectric stack structure 215, which may include oxide layers 216 and 220, and nitride layers 218 and 222-226, encapsulates the Ge active region 214 during the crystallization process of the Ge active region 214 in order to prevent crystalline defects and contamination as a result of outdiffusion that may occur during high-temperature processes (e.g., epitaxial growth). The oxide and nitride layer of the dielectric stack structure 215 may have thicknesses that vary from, for example, about 1000-3000 Å. Also, each of the nitride and oxide layers may include different stress characteristics (e.g., compressive or tensile characteristics). A barrier nitride layer 228, such as silicon nitride ($Si_3N_4$), may be deposited over nitride layer 226 of the dielectric stack 215. The barrier nitride ($Si_3N_4$) may be used as an etch stop during subsequent process steps (e.g., see FIG. 2B).

As depicted in FIG. 2A, during a prior photolithographic process (not shown), opening 232 is etched (e.g., using a dry etch such as a reactive ion etch) into the dielectric stack structure 215. Accordingly, the etch process etches down to the upper surface 236 of the Ge active region 214 by etching through barrier nitride layer 228, nitride layers 222-126, oxide layer 220, and hard mask layer 234. As illustrated, a portion P of the Ge active region 214 is now exposed for facilitating the Schottky contact integration process. Opening 232 may have a depth of about 3000 Å and a diameter/width of approximately 0.15-0.25 μm.

A metal layer 240 may then be deposited over the entire integrated photonic semiconductor structure 200. As illustrated, the metal layer 140 also lines the walls and floor of opening 232. The metal layer 240 may include, for example, a titanium nitride (TiN), tantalum nitride (TaN), pulse nucleation layer tungsten (W PNL), and physical vapor deposition tungsten (W PVD) material. The metal layer 240 is selected to be a material that does not intermix with the Ge active region 214 during subsequent process steps (e.g., thermal anneals).

Prior to depositing the metal layer 240, the surface of the Ge active region 214 may be modified by a barrier tailor implant. Such a barrier tailor implant process is self-aligned with the walls of the dielectric stack structure 215 created by opening 232. For example, n-type dopants such as phosphorous (P), nitrogen (N), arsenic (As), antimony (Sb), or sulfur (S) may be implanted into the surface of the Ge active region 214 in order to increase the barrier height for holes and reduce dark current. Alternatively, p-type dopants such as boron (B) or indium (In) may be implanted into the surface of the Ge active region 214 in order to increase the barrier height for electrons, also reducing dark current.

Figure 2B:
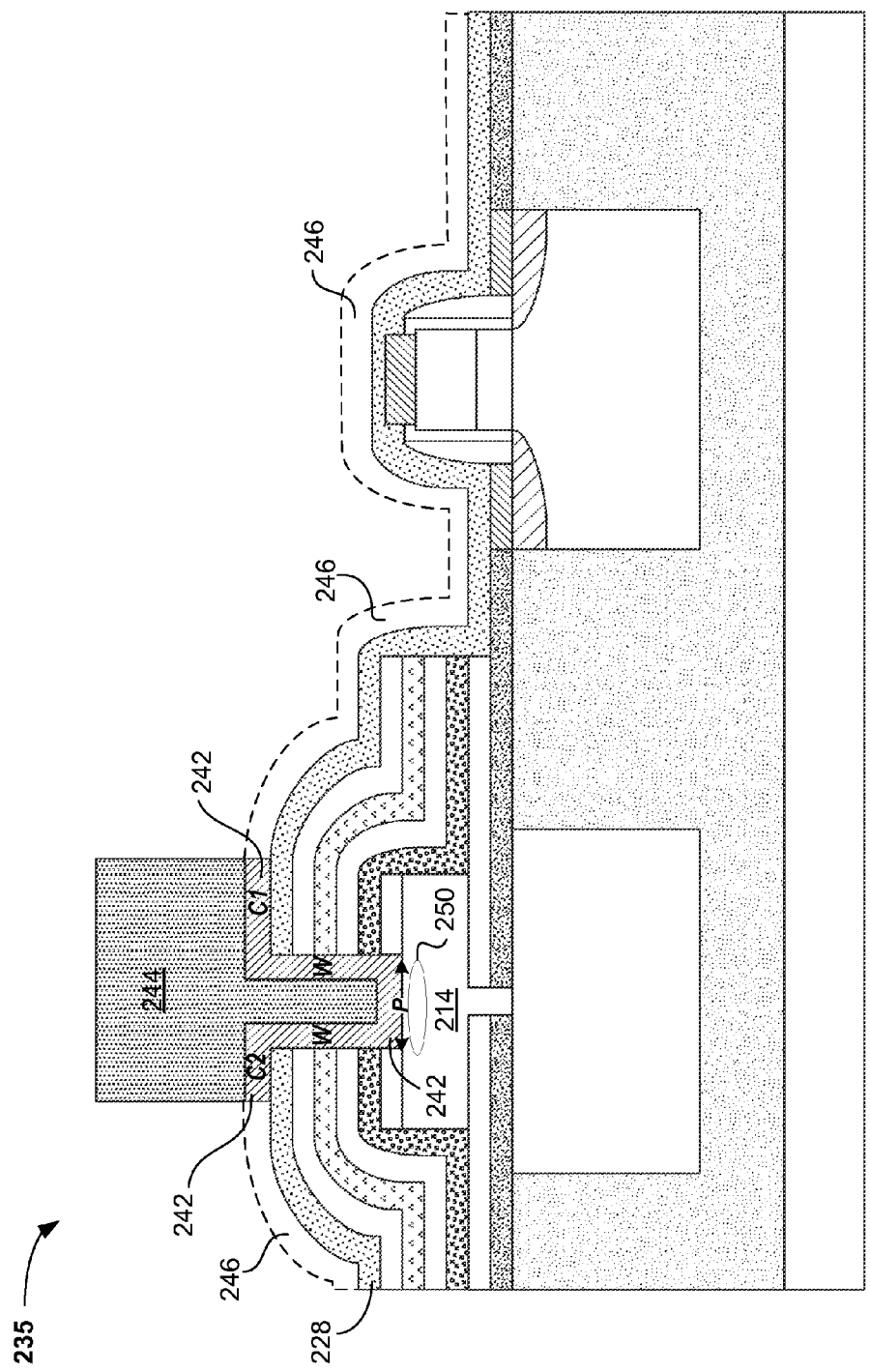

Referring to FIG. 2B, integrated photonic semiconductor structure 235 may be formed by photolithographically patterning and etching integrated photonic semiconductor structure 200 (FIG. 2A). As illustrated, metal layer portion 242 is protected by patterned photo resist layer 244 during a subsequent etch of the remaining portion of the metal liner 240, as indicated by dotted region 246. The barrier nitride layer 228 may act as an etch stop during the etching of the remaining portion of the metal layer designated by dotted region 246. Thus, metal layer portion 242 may be formed by etching away metal region 246 from the surface of the integrated photonic semiconductor structure 235. The metal layer portion 242 directly contacts portion P of the Ge active region 114 that is exposed by the opening 232 (FIG. 2A) to form a metal-germanium (Ge) Schottky landing contact 242. As shown, the metal-germanium (Ge) Schottky landing contact 242 may include landing contacts C1 and C2, as well liner W, which lines the walls and floor of opening 232 (FIG. 2A). As described above, n-type or p-type dopants may (optionally) be implanted into the surface of the Ge active region 214, as defined at region 250, in order to reduce dark current for the metal-Ge Schottky landing contact 242.

Figure 2C:
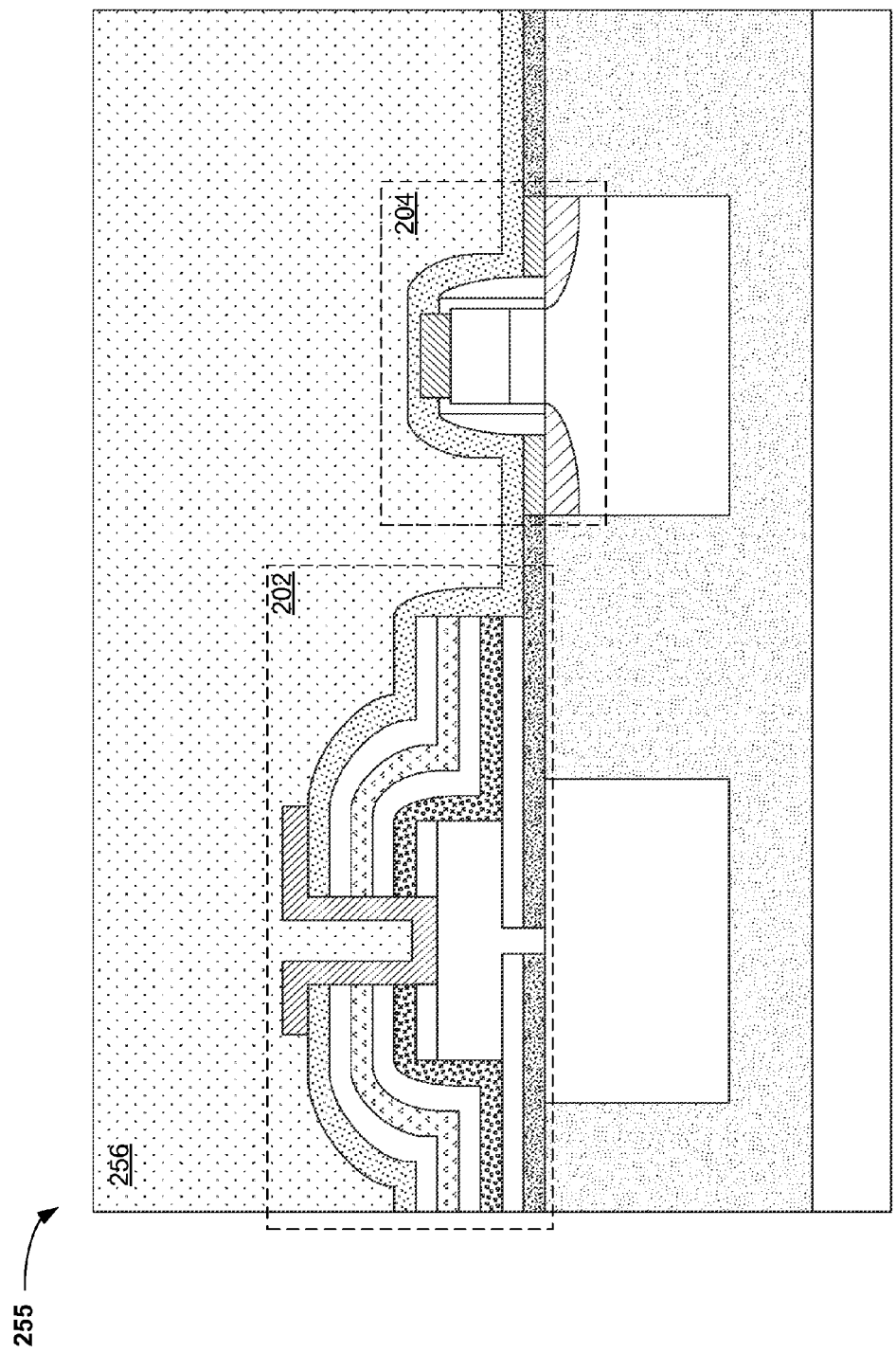

As illustrated in FIG. 2C, integrated photonic semiconductor structure 255 may be formed by depositing a thick oxide layer (e.g., 1 μm thickness) of borophosphosilicate glass (BPSG) 256 over integrated photonic semiconductor structure 235 (FIG. 2B) and planarizing the BPSG layer 256 using, for example, chemical mechanical polishing (CMP). The BPSG layer 256 may be used in subsequent contact formation steps corresponding to both the Germanium (GE) photodetector 202 and the FET transistor 204.

Figure 2D:
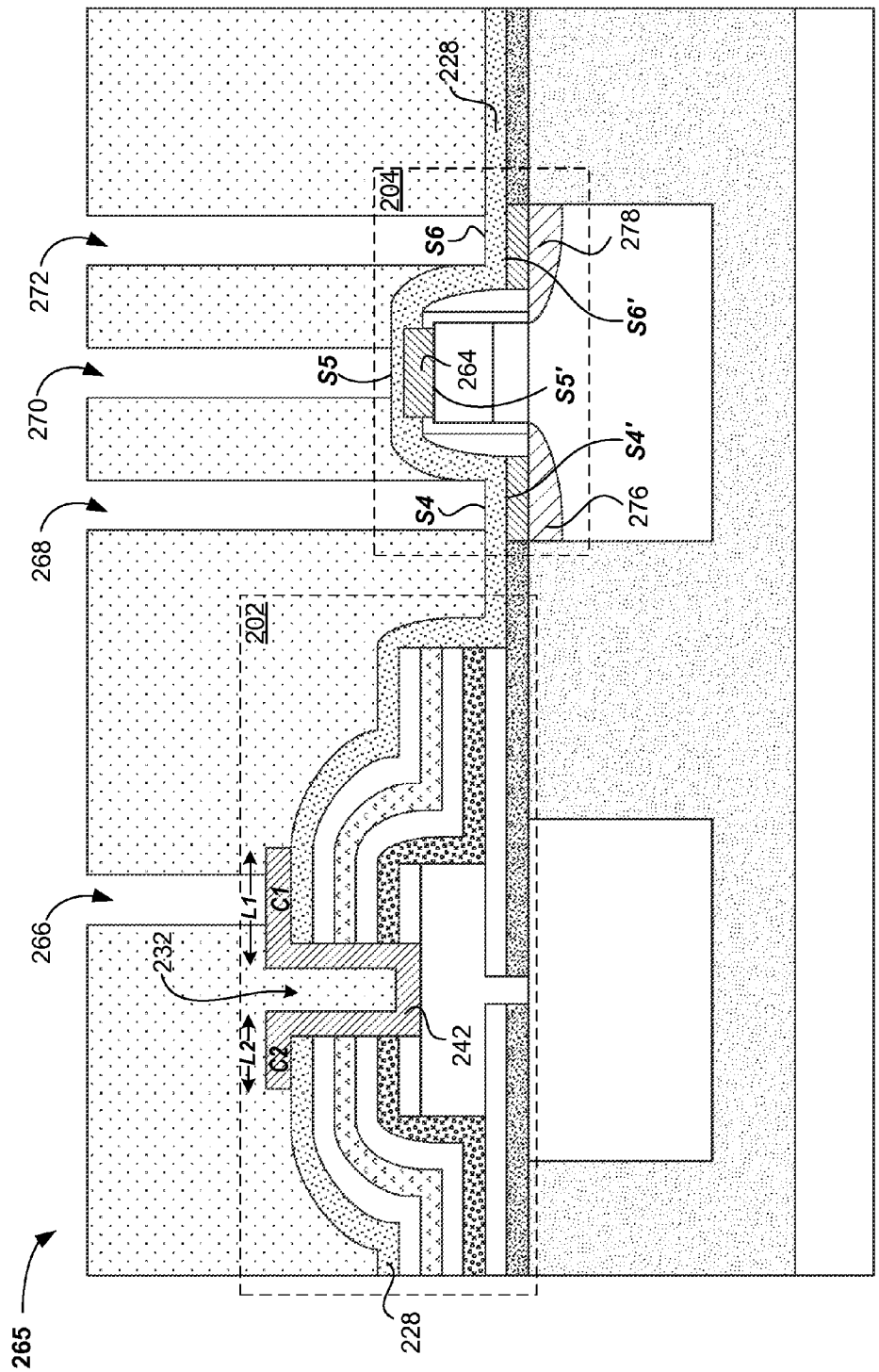

Referring to FIG. 2D, integrated photonic semiconductor structure 265 may be formed by photolithographic patterning and etching of integrated photonic semiconductor structure 255 (FIG. 2C). Particularly, the BPSG layer 256 (FIG. 2C) may be patterned, within the same mask, and etched to created contact holes 266-272. The contact holes 266-272 establish the forming of electrical contact to both the Germanium (Ge) photodetector 202 and the FET transistor 204 devices. As depicted, contact hole 266 facilitates the creation of an electrical contact to landing contact C1 of the metal-germanium (Ge) Schottky landing contact 242. According to another implementation, in place of landing contact C1, a contact hole (not shown) may be created for providing an electrical contact to landing contact C2 of the metal-germanium (Ge) Schottky landing contact 242. Also, contact hole 270 facilitates the creation of an electrical contact to the gate silicide contact 264 of FET transistor 204, while contact holes 268 and 272 enable the formation of electrical contacts to source/drain silicide contacts 276 and 278 of FET transistor 204, respectively. As depicted, contact hole 266 does not have to be aligned with opening 232, as with the previously described exemplary embodiment of FIG. 1F. Thus, according to the alternative embodiment of FIG. 2D, landing contact C1 or C2 provide an increased etch misalignment tolerance, since a contact hole can be formed anywhere along length L1 of landing contact C1 or length L2 of landing contact C2.

As illustrated, the barrier nitride layer 228 covering the FET transistor 204 acts as an etch stop, which impedes the contact holes 276-278 from extending down beyond surfaces S4-S6. Accordingly, during a subsequent etch process (not shown), the barrier nitride layer 228 over surfaces S4-S6 is etched away (see FIG. 2E) in order to extend contact holes 268, 270, and 272 down to surfaces S4'-S6' of silicide contacts 276, 264, and 278, respectively.

Figure 2E:
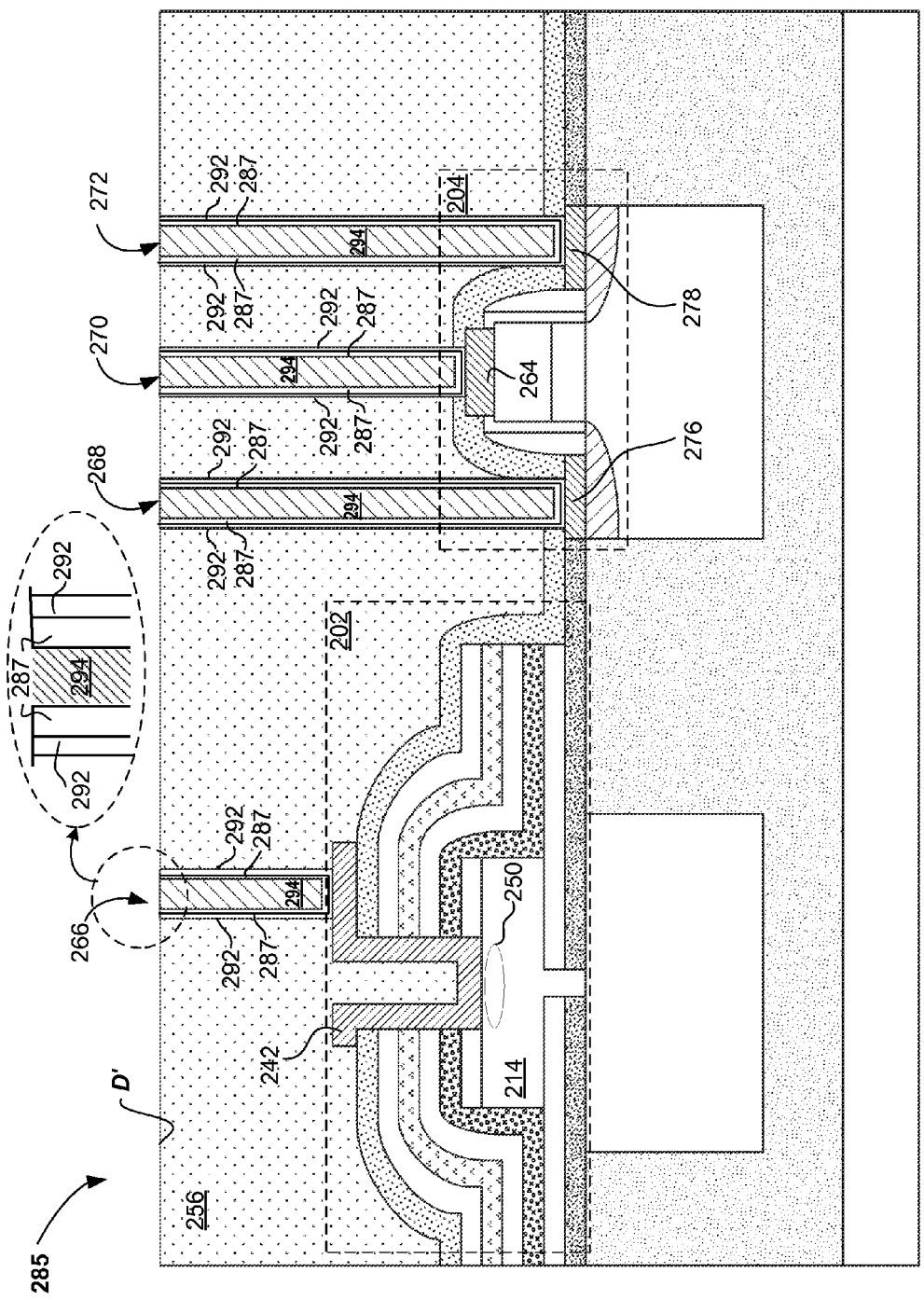

Referring to FIG. 2E, integrated photonic semiconductor structure 285 may be formed by depositing a first metal liner 292 over the sidewalls and floor of contact holes 266-272 of integrated photonic semiconductor structure 265 (FIG. 2D). The first metal liner 292 may, for example, include a layer of titanium (Ti). A second liner 287 may be deposited over first metal liner 292 within contact holes 266-272. The second liner 287 may, for example, include a layer of titanium nitride (TiN).

Once the TiN liner 287 is deposited over the Ti metal liner 292, a thermal anneal is carried out in order cause the deposited Ti/TiN liners 287, 292 to metallically intermix with the cobalt silicide ($CoSi_2$) contacts 264, 276, 278 of the CMOS FET transistor 204. This intermixing provides a lower Ohmic contact resistance between the deposited Ti/TiN liners 287, 292 and the cobalt silicide ($CoSi_2$) contacts 264, 276, 278 of the CMOS FET device 204. Following the anneal process; a tungsten metal fill 294 is deposited over the TiN liner 287 within the contact holes 266-272. Any excess tungsten associated with the fill process is planarized down to the upper surface D' of the BPSG layer 256.

During the thermal anneal process, which provides a reduction in Ohmic contact resistance with respect to the silicide ($CoSi_2$) contacts 264, 276, 278, undesirable intermixing between the material of the deposited Ti/TiN liners 287, 292 and the Ge active region 214 is avoided based on the intermediary of the metal-germanium (Ge) Schottky landing contact 242 isolating the Ti/TiN liners 287, 292 from the Ge active region 214. Particularly, during the thermal anneal process, the metal-germanium (Ge) Schottky landing contact 242 material does not intermix with the Ge active region 214 causing undesirable excess dark current. Also, as previously described, the increased barrier height of the metal-germanium (Ge) Schottky landing contact 242 created by barrier tailor implants within region 250 of the Ge active region 214 may further reduce dark current by unpinning the Fermi level within the active region 214. Thus, while the thermal anneal process causing metal intermixing is a beneficial process with respect to the CMOS FET device 204; any resulting metal intermixing may be detrimental to the photodetector 202 as a result of causing an increase in dark current. Thus, the reduction in dark current may be at least two-fold. Firstly, the barrier tailor implanting may shift the Fermi level and increase the barrier height for electrons or holes. Secondly, less metal intermixing may reduce dangling bonds which reduce electrons from midgap states from contributing to the dark current.

FIGS. 3A-3F are vertical cross-sectional views of an integrated photonic semiconductor structure during Schottky contact integration according to yet another exemplary embodiment. The integrated photonic semiconductor structure 305 may include a photonic device such as a Germanium (GE) photodetector 301 and a CMOS device such as an FET transistor 303. The integrated photonic semiconductor structure 305 may further include an optical waveguide structure 307, a buried oxide (BOX) region 309, a shallow trench isolation (STI) region 311, and silicon substrate 313. The BOX region 309 is located over the silicon substrate 313. The optical waveguide structure 307 may be formed within the BOX region 309 in order to facilitate optical confinement and low-loss waveguiding. The STI region 311 may provide electrical isolation between the Germanium (Ge) photodetector 301 and the FET transistor 303.

As depicted, the Germanium (Ge) photodetector 301 may include a Ge active region 306 for receiving and detecting an optical signal from optical waveguide structure 307. The optical signal traversing within the optical waveguide structure 307 may be received by the active region 306 through a thin oxide layer 316 and a thin nitride layer 318. Although any received optical signal received by the active region 306 is attenuated by thin layers 316 and 318, this attenuation is low enough in order to not impede the operation of the photodetector. For example, thin oxide layer 316 may be about 50 Å and thin nitride layer 318 may be about 400 Å.

As previously described, the thin oxide layer 316 and thin nitride layer 318, along with oxide layer 320 and nitride layers 322-326, may create a dielectric stack structure 315 that encapsulates the Ge active region 306 of the photodetector 301. The dielectric stack structure 315, which may include oxide layers 316 and 320, and nitride layers 318 and 322-326, encapsulates the Ge active region 306 during the crystallization process of the Ge active region 306 in order to prevent crystalline defects and contamination as a result of outdiffusion that may occur during high-temperature processes (e.g., epitaxial growth). The oxide and nitride layer of the dielectric stack structure 315 may each have thicknesses that vary from, for example, about 1000-3000 Å. Also, each of the nitride and oxide layers may include different stress characteristics (e.g., compressive or tensile characteristics). A barrier nitride layer 328, such as silicon nitride ($Si_3N_4$), may be deposited over nitride layer 326 of the dielectric stack 315.

Figure 3A:
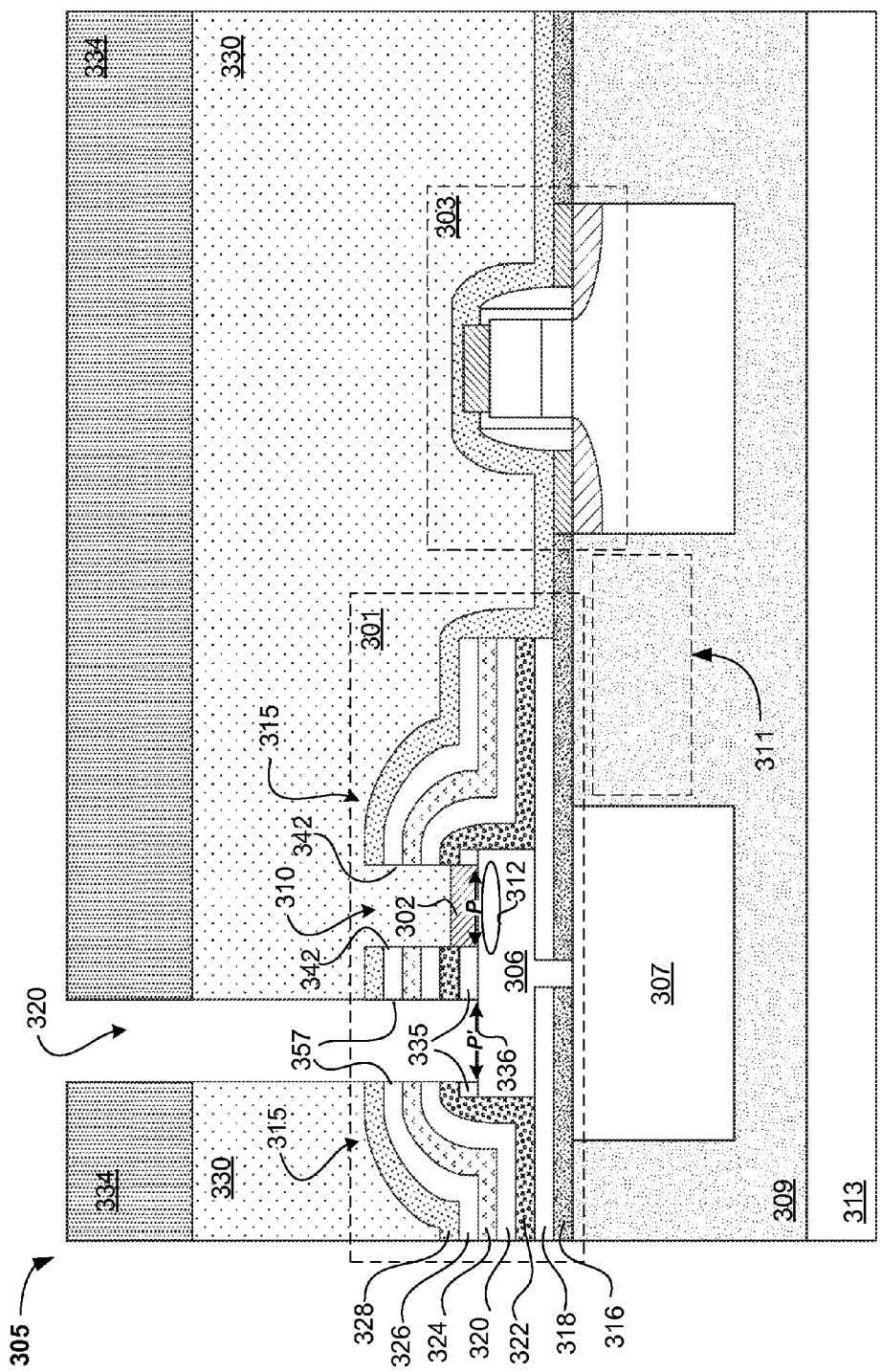
FIGS. 3A-3E are vertical cross-sectional views of an integrated photonic semiconductor device structure during Schottky contact integration according to yet another exemplary embodiment.

As depicted in FIG. 3A, using the same or similar processes than those described and illustrated in relation to FIGS. 1A-1C, integrated photonic semiconductor structure 305 may include metal contact layer 302, which directly contacts portion P of the Ge active region 306 to form a metal-germanium (Ge) Schottky contact 302 within opening 310. Opening 310 may have a depth of about 3000 Å and a diameter/width of approximately 0.15-0.25 μm.

As previously described, prior to formation of the metal-Ge Schottky contact 302 within opening 310, n-type or p-type dopants may (optionally) be implanted into the surface of the Ge active region 306, as defined at region 312. The implants in the surface of the Ge active region 306 may reduce dark current. Such a barrier tailor implant process is self-aligned with the walls 342 of the dielectric stack structure 315 created by opening 310. For example, n-type dopants such as phosphorous (P), nitrogen (N), arsenic (As), antimony (Sb), or sulfur (S) may be implanted into the surface of the Ge active region 306 in order to increase the barrier height for holes and reduce dark current. Alternatively, p-type dopants such as boron (B) or indium (In) may be implanted into the surface of the Ge active region 306 in order to increase the barrier height for electrons, also reducing dark current.

As illustrated in FIG. 3A, a layer of BPSG 330 (e.g., 1 μm thickness) is deposited over integrated photonic semiconductor structure 305. Following a photolithographic process, the layer of BPSG 330 is etched using patterned photoresist layer 334. During the etch process (e.g., a dry etch such as a reactive ion etch), a second opening 320 is created in the dielectric stack structure 315. Accordingly, the etch process etches down to upper surface 336 of the Ge active region 306 by etching through barrier nitride layer 328, nitride layers 322-326, oxide layer 320, and hard mask layer 335. As illustrated, a portion P' of the Ge active region 306 is now exposed for facilitating a second metal-Ge Schottky contact in addition to metal-Ge Schottky contact 302.

Figure 3B:
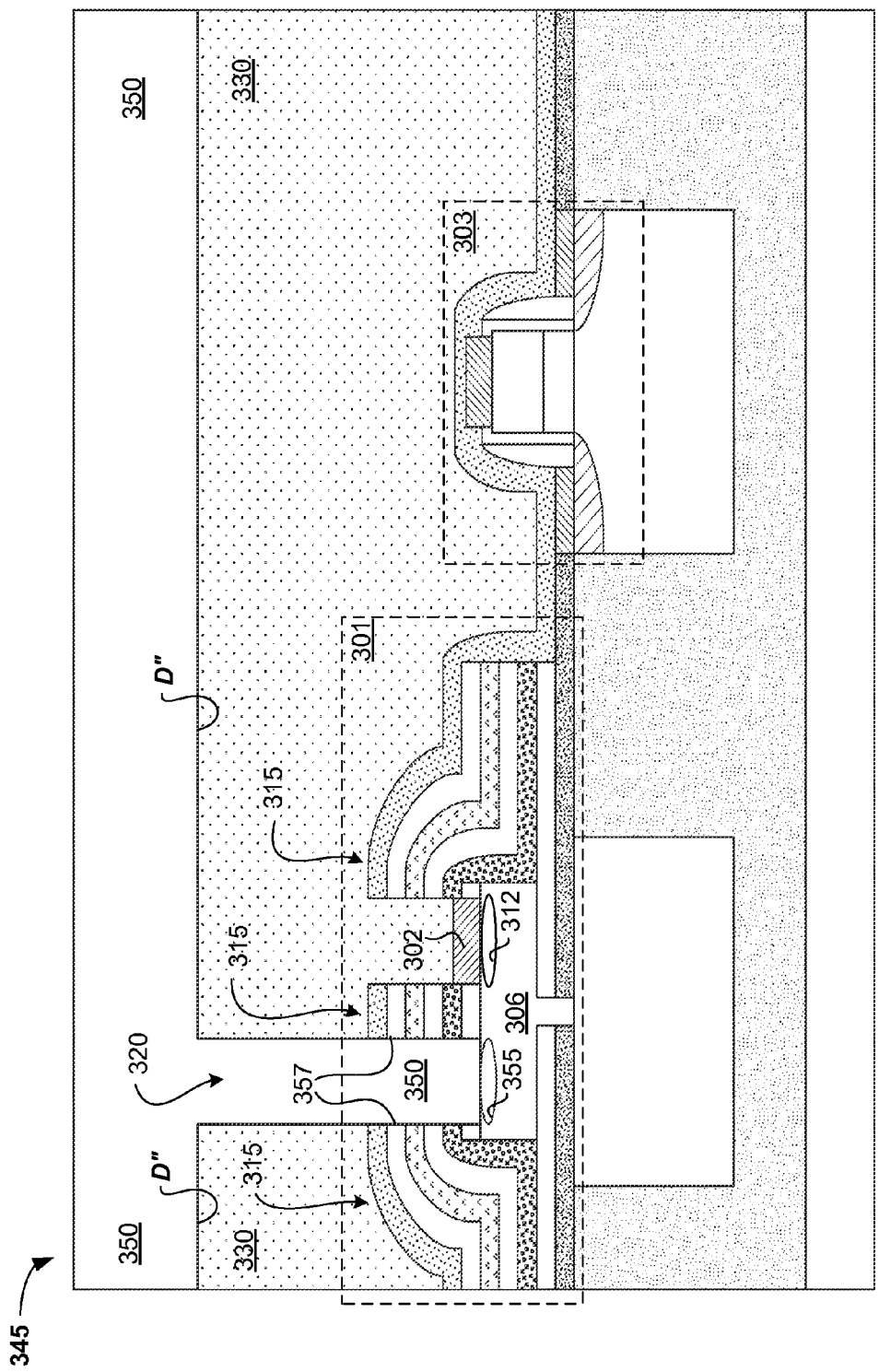

Referring to FIG. 3B, in structure 345 the patterned photoresist layer 334 (FIG. 3A) is stripped. Following the stripping of the patterned photoresist layer 334 (FIG. 3A), a second metal layer 350 having a different metal work function to that of the metal used to form metal-Ge Schottky contact 302 is deposited within the second opening 320 and over the upper surface (D") of the layer of BPSG 330. Both the deposited second metal 350 and the metal used in the formation of the metal-Ge Schottky contact 302 may include, for example, titanium nitride (TiN), tantalum nitride (TaN), pulse nucleation layer tungsten (W PNL), and physical vapor deposition tungsten (W PVD). As previously described, the titanium nitride (TiN), tantalum nitride (TaN), pulse nucleation layer tungsten (W PNL), and physical vapor deposition tungsten (W PVD) are utilized because they do not intermix with the Ge active region 306 during subsequent process steps (e.g., thermal anneals).

Prior to filling opening 320 with the second metal 350, n-type or p-type dopants may (optionally) be implanted into the surface of the Ge active region 306, as defined at region 355. The implants in the surface region 355 of the Ge active region 306 may reduce dark current. Such a barrier tailor implant process is self-aligned with the walls 357 of the dielectric stack structure 315 created by opening 320. For example, n-type dopants such as phosphorous (P), nitrogen (N), arsenic (As), antimony (Sb), or sulfur (S) may be implanted into the surface region 355 of the Ge active region 306 in order to increase the barrier height for holes and reduce dark current. Alternatively, p-type dopants such as boron (B) or indium (In) may be implanted into the surface region 355 of the Ge active region 306 in order to increase the barrier height for electrons, also reducing dark current.

The barrier height between the Ge active region 306 and a direct metallic contact forming a Schottky contact may be determined by both the work function of the metal material corresponding to the metal contact and the implant type (e.g., n-type or p-type) applied to the Ge active region 306.

As depicted in FIG. 3B, in one implementation, for example, metal-Ge Schottky contact 302 and implant region 312 may provide an increased barrier height for electrons, whereby p-type dopants such as boron (B) or indium (In) may be implanted. In such an implementation, the second metal 350 in contact with implant region 355 of the Ge active region 306 may provide an increased barrier height for holes, whereby n-type dopants such as phosphorous (P), nitrogen (N), arsenic (As), antimony (Sb), or sulfur (S) may be implanted.

In an alternative implementation, for example, metal-Ge Schottky contact 302 and implant region 312 may provide an increased barrier height for holes, whereby n-type dopants such as phosphorous (P), nitrogen (N), arsenic (As), antimony (Sb), or sulfur (S) may be implanted. In such an alternative implementation, the second metal 350 in contact with implant region 355 of the Ge active region 306 may provide an increased barrier height for electrons, whereby p-type dopants such as boron (B) or indium (In) may be implanted. In the above-described implementations, the barrier height for both holes and electrons associated with the Schottky contact regions (i.e., metal contact/Ge active region interface) are optimized to minimize dark current produced by the Ge active region 306 for the photodetector 301.

Figure 3C:
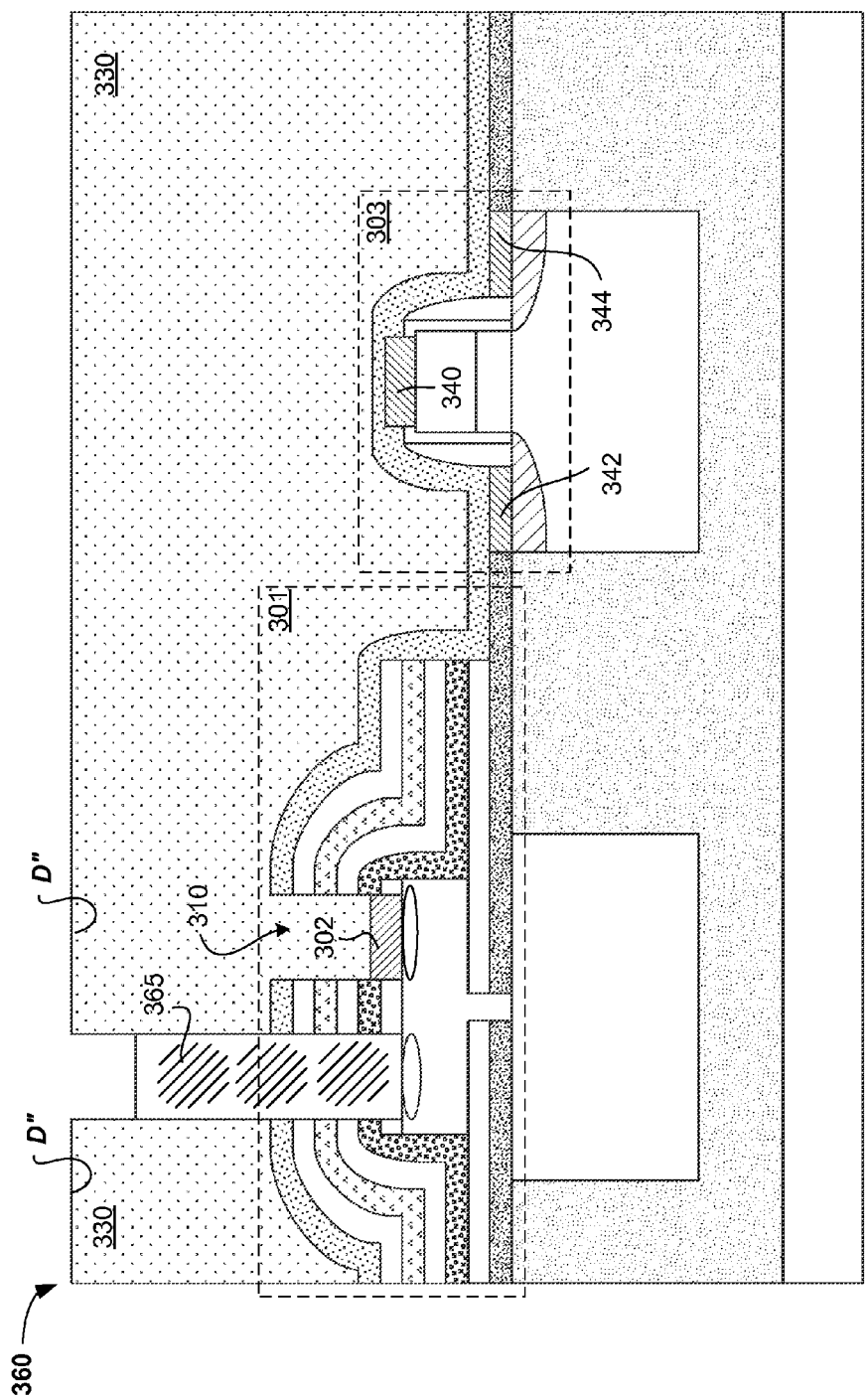

As illustrated in FIG. 3C, integrated photonic semiconductor structure 360 may be formed by blanket etching the deposited second metal 350 (FIG. 3B) associated with integrated photonic semiconductor structure 345 (FIG. 3B). By blanket etching, the deposited second metal 350 (FIG. 3B) is recessed below the upper surface D" of the BPSG layer 330 to form a second metal-Ge Schottky contact 365. In some implementations, based on the blanket etching, the second metal-Ge Schottky contact may be formed to substantially have the same physical dimension as metal-Ge Schottky contact 302. In the illustrated implementation, the second metal-Ge Schottky contact 365 is larger than the metal-Ge Schottky contact 302. The formation of the larger metal-Ge Schottky contact 365 may, for example, compensate for different etch rates, whereby the second metal-Ge Schottky contact 365 may be etched at a faster rate than that of metal-Ge Schottky contact 302 based on the use of different metallic materials. Moreover, the formation of the larger metal-Ge Schottky contact 365 may, for example, require less liner and metal fill deposition during contact integration (see FIG. 3F) in comparison to metal-Ge Schottky contact 302 and silicide contacts 340, 342, and 344, which may require deeper contact holes.

Figure 3D:
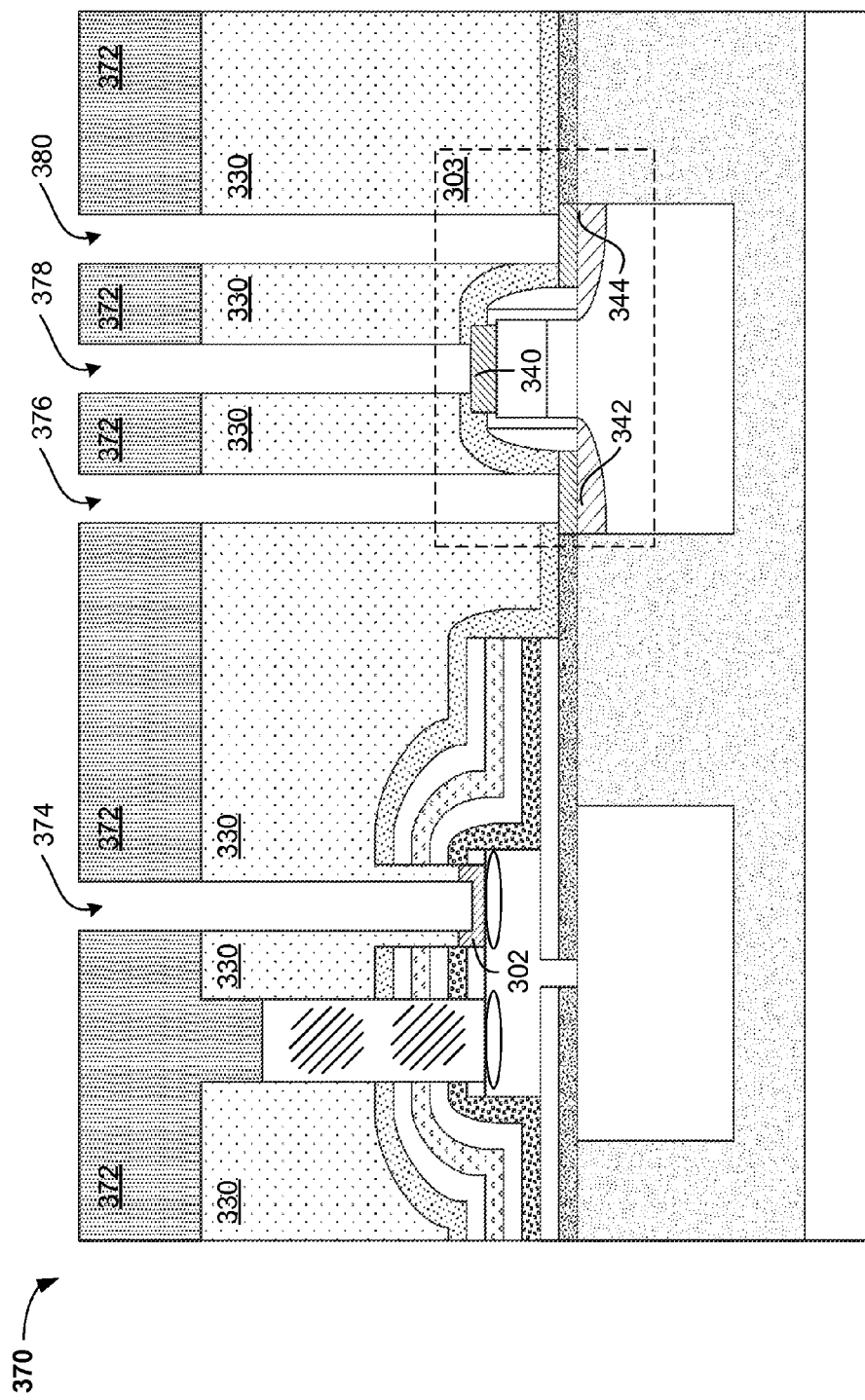

Referring to FIG. 3D, integrated photonic semiconductor structure 370 may be formed by depositing, patterning, and etching photoresist layer 372 in order to produce contact holes in integrated photonic semiconductor structure 360 (FIG. 3C). Particularly, contact hole 374 is etched into the BPSG material within opening 310 (FIG. 3C) in order to facilitate the establishment of an electrical connection with metal-Ge Schottky contact 302. Additionally, contact holes 376-380 are produced by etching into a region of the BPSG material 330 (FIG. 3C) located over the FET transistor 303 in order to form electrical connectivity with the respective silicide contacts 342, 340, 344 of transistor 303.

Figure 3E:
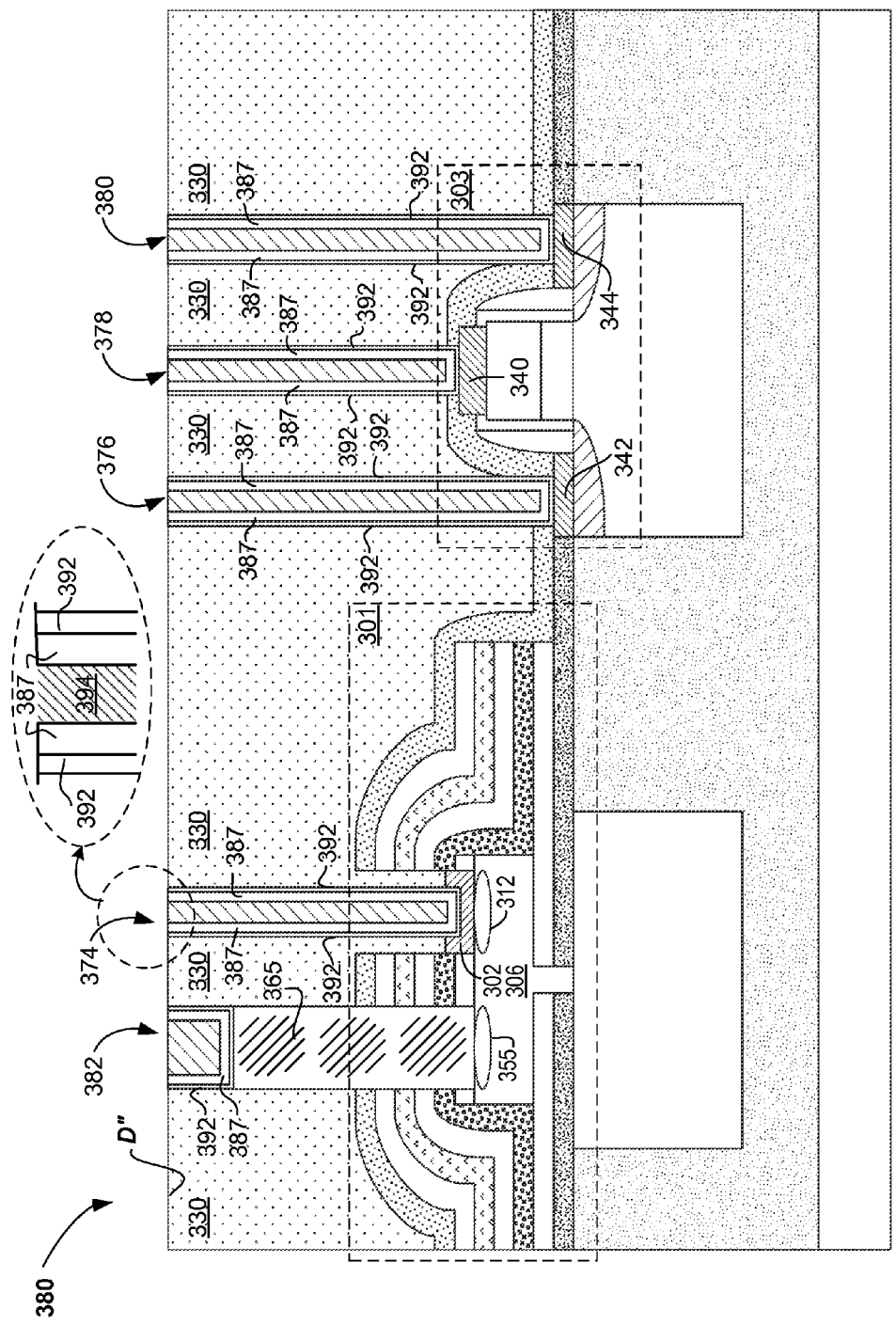

Referring to FIG. 3E, integrated photonic semiconductor structure 380 may be formed by removing the patterned and etched photoresist layer 372 (FIG. 3D) of integrated photonic semiconductor structure 370 (FIG. 3D), and subsequently forming electrical connections with metal-Ge Schottky contact 302, metal-Ge Schottky contact 365, and silicide contacts 340-344. Accordingly, a first metal liner 392 is deposited over the sidewalls and floor of contact holes 376-382 of the integrated photonic semiconductor structure 380. As depicted, contact hole 382 is formed by removing the photoresist material (see FIG. 3D) covering metal-Ge Schottky contact 365. The first metal liner 392 may, for example, include a layer of titanium (Ti). A second liner 387 may be deposited over first metal liner 392 within contact holes 376-382. The second liner 387 may, for example, include a layer of titanium nitride (TiN).

Once the TiN liner 387 is deposited over the Ti metal liner 392, a thermal anneal is carried out in order to cause the deposited Ti/TiN liners 287, 292 to metallically intermix with the cobalt silicide ($CoSi_2$) contacts 342, 340, 344 of the CMOS FET transistor 301. This intermixing provides a lower Ohmic contact resistance between the deposited Ti/TiN liners 387, 392 and the cobalt silicide ($CoSi_2$) contacts 342, 340, 344 of the CMOS FET device 301. Following the anneal process; a tungsten metal fill 394 is deposited over the TiN liner 387 within the contact holes 376-382. Any excess tungsten associated with the fill process may be planarized down to the upper surface D" of the BPSG layer 330.

During the thermal anneal process, which provides a reduction in Ohmic contact resistance for the silicide ($CoSi_2$) contacts 342, 340, 344, undesirable intermixing between the material of the deposited Ti/TiN liners 387, 392 and the Ge active region 306 is avoided via the intermediary of metal-Ge Schottky contacts 302 and 365. This is based on the metal-Ge Schottky contacts 302 and 365 isolating the Ti/TiN liners 387, 392 from the Ge active region 306. Therefore, the Ti/TiN liners 387, 392 may not undesirably intermix with the Ge active region 306. Also, during the thermal anneal process, the metal-Ge Schottky contacts 302, 365 materials do not intermix with the Ge active region 306 causing undesirable excess dark current.

Also, as previously described, the increased barrier height of the metal-Ge Schottky contacts 302, 365 created by barrier tailor implants within respective regions 312 and 355 of the Ge active region 306 may further reduce dark current by unpinning the Fermi level within the active region 306. Thus, while the thermal anneal process causing metal intermixing is a beneficial process with respect to the CMOS FET device 303; any resulting metal intermixing may be detrimental to the photodetector 301 as a result of causing an increase in dark current. Thus, the reduction in dark current may be at least two-fold. Firstly, the barrier tailor implanting may shift the Fermi level and increase the barrier height for electrons or holes. Secondly, less metal intermixing may reduce dangling bonds which reduces electrons from midgap states from contributing to the dark current.

Figure 4:
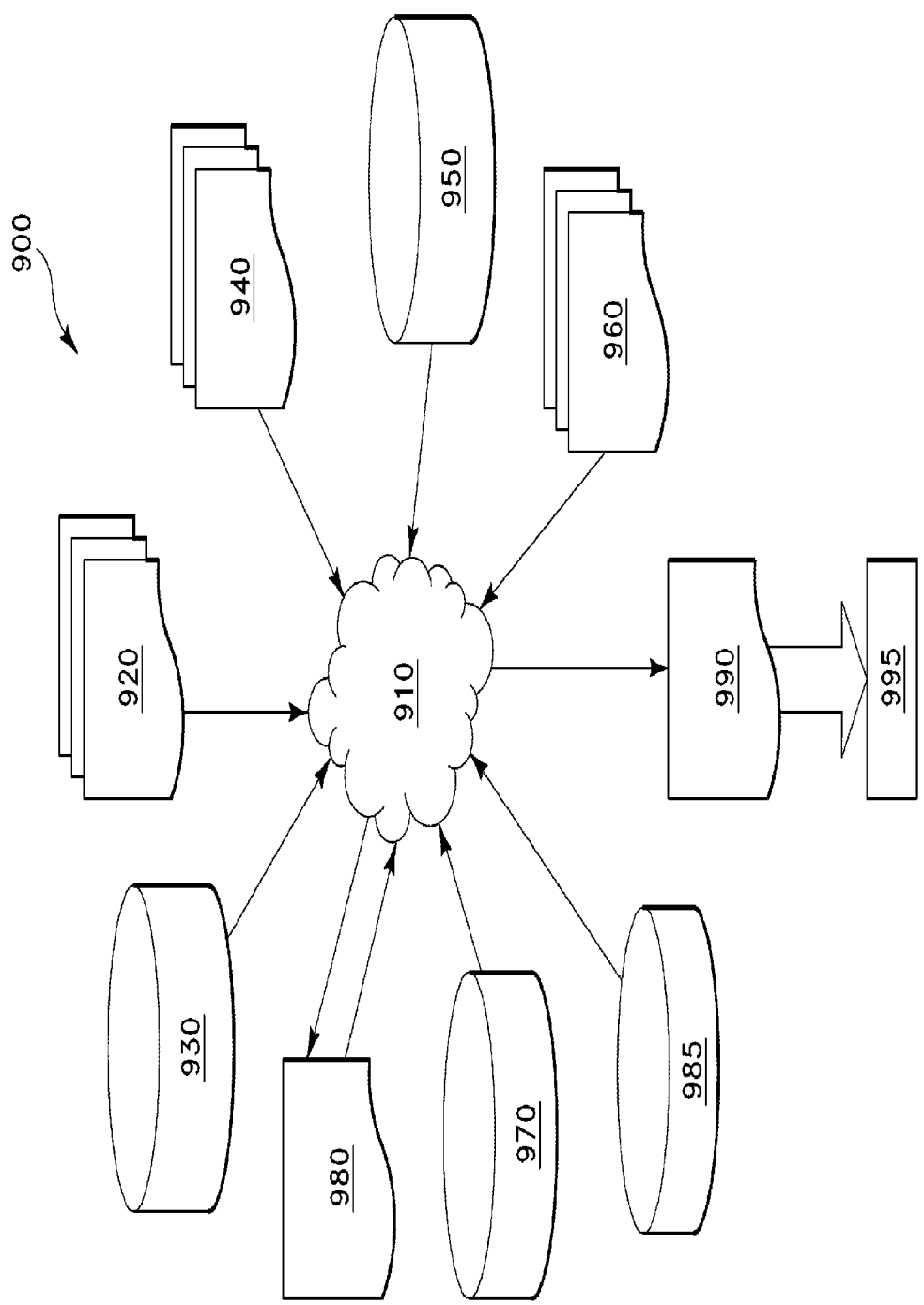
FIG. 4 is a flow diagram of a design process used in semiconductor design, manufacture, and/or test.

FIG. 4 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1I, 2E & 3E. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. In one embodiment, the design structure 920 comprises design data used in a design process and comprising information describing one or more embodiments of the invention with respect to the structures as shown in FIGS. 1I, 2E & 3E. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention, as shown in FIGS. 1I, 2E & 3E. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1I, 2E & 3E. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1I, 2E & 3E to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1I, 2E & 3E. In one embodiment, design structure 990 may comprise a compiled, executable HDL simulation model that functionally simulates the devices shown in FIGS. 1I, 2E & 3E.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1I, 2E & 3E. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. A method of forming an integrated photonic semiconductor structure having a photodetector device and a CMOS device comprising:
    depositing a dielectric stack over the photodetector device, wherein the dielectric stack encapsulates the photodetector;
    etching an opening into the dielectric stack down to an upper surface of a region of an active area of the photodetector;
    depositing, via the opening, a first metal layer directly onto the upper surface of the region of the active area, the first metal layer covering the region of the active area;
    forming, within a same mask level, a plurality of contacts including a second metal layer, the second metal layer located on the first metal layer and on at least one contact area corresponding to the CMOS device;
    wherein the first metal layer isolates the active area from an occurrence of metal intermixing between the second metal layer and the active area of the photodetector, wherein forming the plurality of contacts comprises:
    depositing an oxide layer over the photodetector device and the CMOS device, wherein the oxide layer fills the opening;
    etching a first opening into a first region of the oxide layer, wherein the first opening extends into the opening of the dielectric stack down to at least an upper surface of the first metal layer;
    etching at least one second opening into a second region of the oxide layer, wherein the second opening extends down to at least an upper surface of the at least one contact area corresponding to the CMOS device;
    depositing the second metal layer as a first liner within the first and the second opening;
    depositing a third metal layer as a second liner over the first liner within the first and the second opening; and
    depositing a metal fill over the second liner within both the first and the second opening, wherein the metal fill substantially fills the first and the second opening.

2. The method of claim 1, wherein the first metal layer forms a metal-germanium Schottky contact with the region of the active area.

3. The method of claim 1, wherein the first metal layer comprises a first metal material corresponding to one of the group consisting of titanium nitride, tantalum nitride, pulse nucleation layer tungsten, and physical vapor deposition tungsten.

4. The method of claim 1, wherein the contacts comprise silicide contact areas corresponding to a CMOS FET transistor device.

5. The method of claim 1, wherein the first liner comprises a titanium liner.

6. The method of claim 5, wherein the second liner comprises a titanium nitride liner.

7. The method of claim 6, wherein the metal fill comprises a tungsten material.

8. The method of claim 1, further comprising:
    implanting, following the etching of the opening, an implant into the region of the active area, wherein the implant modifies Schottky barrier height between the first metal layer and the region of the active area coupled to the first metal layer.

9. The method of claim 8, wherein the active region comprises a germanium material.

10. The method of claim 9, wherein the implant comprises at least one of the group consisting of phosphorous (P), nitrogen (N), arsenic (As), antimony (Sb), sulfur (S), boron (B), and indium (In).

11. The method of claim 1, wherein depositing the first metal layer comprises forming a metal contact liner that extends from within the opening in the dielectric stack to an upper surface region of the dielectric stack adjacent the opening.

* * * * *